(12) United States Patent
Oikawa et al.

(10) Patent No.: US 9,898,201 B2
(45) Date of Patent: Feb. 20, 2018

(54) NON-VOLATILE MEMORY DEVICE, AND STORAGE APPARATUS TO REDUCE A READ RETRY OCCURRENCE FREQUENCY AND PREVENT READ PERFORMANCE FROM LOWERING

(71) Applicant: HITACHI, LTD., Tokyo (JP)

(72) Inventors: Yoshihiro Oikawa, Tokyo (JP); Hiroshi Hirayama, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/122,669

(22) PCT Filed: Mar. 24, 2014

(86) PCT No.: PCT/JP2014/058134
§ 371 (c)(1),
(2) Date: Aug. 31, 2016

(87) PCT Pub. No.: WO2015/145552
PCT Pub. Date: Oct. 1, 2015

(65) Prior Publication Data
US 2017/0075574 A1    Mar. 16, 2017

(51) Int. Cl.
*G11C 8/00*    (2006.01)
*G06F 3/06*    (2006.01)
(Continued)

(52) U.S. Cl.
CPC ........... *G06F 3/061* (2013.01); *G06F 3/06* (2013.01); *G06F 3/0655* (2013.01); *G06F 3/0679* (2013.01); *G06F 11/1004* (2013.01); *G06F 11/1076* (2013.01); *G06F 12/0238* (2013.01); *G06F 12/16* (2013.01); *G11C 16/16* (2013.01); *G06F 2212/1016* (2013.01); *G06F 2212/7208* (2013.01)

(58) Field of Classification Search
None
See application file for complete search history.

(56) References Cited

U.S. PATENT DOCUMENTS

2003/0196147 A1    10/2003    Hirata et al.
2007/0091677 A1    4/2007    Lasser et al.
(Continued)

FOREIGN PATENT DOCUMENTS

JP    2000-148604 A    5/2000
JP    2011-100519 A    5/2011
(Continued)

*Primary Examiner* — Harry W Byrne
*Assistant Examiner* — Sultana Begum
(74) *Attorney, Agent, or Firm* — Volpe and Koenig, P.C.

(57) ABSTRACT

A non-volatile memory device includes a non-volatile memory and a memory controller which executes read from the non-volatile memory using a read option. The non-volatile memory includes a plurality of memory area units (e.g. dies described below), and each memory area unit includes a plurality of memory areas (e.g. pages). The memory controller holds management information in which a read option is recorded per memory area unit which is a unit larger than a memory area which is a read unit. The memory controller specifies a memory area unit including a read source memory area, selects a read option matching the specified memory area unit, and executes read from the read source memory area using the selected read option.

17 Claims, 25 Drawing Sheets

(51) Int. Cl.
*G06F 12/16* (2006.01)
*G06F 12/02* (2006.01)
*G06F 11/10* (2006.01)
*G11C 16/16* (2006.01)

(56) References Cited

U.S. PATENT DOCUMENTS

2011/0066899 A1    3/2011   Kang et al.
2011/0182119 A1    7/2011   Strasser et al.
2012/0268994 A1   10/2012   Nagashima

FOREIGN PATENT DOCUMENTS

| PE count | Elapsed time | Bus# | CE# | Die# | Selected option# | Plane# | Page | Read option# | MAX counter | MAX option# | Success counter |
|---|---|---|---|---|---|---|---|---|---|---|---|
| 0 | 0 | 0 | 0 | 0 | 0 | 0 | MSB 1 | 0 | 10000 | 0 | 10000 |
| | | | | | | | MSB 2 | .. | .. | .. | .. |
| | | | | | | | LSB 1 | N-1 | .. | .. | 1 |
| | | | | | | | LSB 2 | .. | .. | .. | .. |
| | | | | | 6 | 1 | MSB 2 | 0 | 10010 | 1 | 10010 |
| | | | | 1 | 1 | 0 | .. | N-1 | .. | .. | 1 |
| | | | | | 2 | 1 | .. | .. | .. | .. | .. |
| | 100~ | .. | L-1 | M-1 | 4 | 1 | .. | N-1 | .. | .. | .. |
| | 200~ | K-1 | L-1 | M-1 | 3 | 1 | .. | N-1 | .. | .. | .. |
| | .. | .. | .. | .. | .. | .. | .. | .. | .. | .. | .. |
| | 700~ | .. | .. | .. | .. | .. | .. | .. | .. | .. | .. |
| | .. | .. | .. | .. | .. | .. | .. | .. | .. | .. | .. |
| 6000~ | .. | .. | .. | .. | .. | .. | .. | .. | .. | .. | .. |
| .. | .. | .. | .. | .. | .. | .. | .. | .. | .. | .. | .. |

FIG. 10
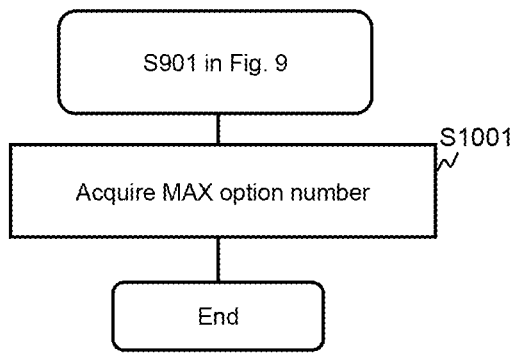
FIG. 11
○ : Conditions are satisfied
× : Conditions are not satisfied
| # Conditions | 1 | 2 | 3 | 4 | 5 | 6 | 7 | 8 |
|---|---|---|---|---|---|---|---|---|
| There is unselected option | False | True | False | True | False | True | False | True |
| Within RR threshold | False | False | True | True | False | False | True | True |
| Within time limit | False | False | False | False | True | True | True | True |
| Conclusion | × | ○ | ○ | ○ | ○ | ○ | ○ | ○ |
FIG. 12
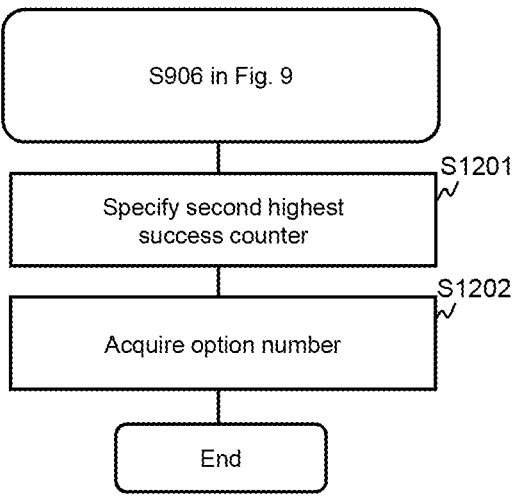

P:RAID level
Q:Number of blocked FMPKs

Normal RR threshold table unit — 1301

| P \ Q | There is no redundancy | | | | | | There is redundancy | | | | | |
|---|---|---|---|---|---|---|---|---|---|---|---|---|
| | Performance-valued | | | Normal | | | Performance-valued | | | Normal | | |
| | Zero | One | Two | Zero | One | Two | Zero | One | Two | Zero | One | Two |
| RAID6 | 2 | 2 | 3 | 3 | 3 | 7 | 2 | 2 | 2 | 3 | 3 | 3 |
| RAID5 | 2 | 3 | - | 3 | 7 | - | 2 | 2 | - | 3 | 3 | - |
| ... | | | | | | | | | | | | |

Reclamation RR threshold table unit — 1302

| P \ Q | There is no redundancy | | | | | | There is redundancy | | | | | |
|---|---|---|---|---|---|---|---|---|---|---|---|---|
| | Performance-valued | | | Normal | | | Performance-valued | | | Normal | | |
| | Zero | One | Two | Zero | One | Two | Zero | One | Two | Zero | One | Two |
| RAID6 | 3 | 3 | 3 | 3 | 3 | 7 | 3 | 3 | 3 | 3 | 3 | 3 |
| RAID5 | 3 | 3 | - | 3 | 7 | - | 3 | 3 | - | 3 | 3 | - |
| ... | | | | | | | | | | | | |

Refresh RR threshold table unit — 1303

| P \ Q | There is no redundancy | | | | | | There is redundancy | | | | | |
|---|---|---|---|---|---|---|---|---|---|---|---|---|
| | Performance-valued | | | Normal | | | Performance-valued | | | Normal | | |
| | Zero | One | Two | Zero | One | Two | Zero | One | Two | Zero | One | Two |
| RAID6 | 7 | 7 | 7 | 7 | 7 | 7 | 7 | 7 | 7 | 7 | 7 | 7 |
| RAID5 | 7 | 7 | - | 7 | 7 | - | 7 | 7 | - | 7 | 7 | - |
| ... | | | | | | | | | | | | |

Asynchronous RR threshold table unit — 1304

| P \ Q | There is no redundancy | | | | | | There is redundancy | | | | | |
|---|---|---|---|---|---|---|---|---|---|---|---|---|
| | Performance-valued | | | Normal | | | Performance-valued | | | Normal | | |
| | Zero | One | Two | Zero | One | Two | Zero | One | Two | Zero | One | Two |
| RAID6 | 7 | 7 | 7 | 7 | 7 | 7 | 7 | 7 | 7 | 7 | 7 | 7 |
| RAID5 | 7 | 7 | - | 7 | 7 | - | 7 | 7 | - | 7 | 7 | - |
| ... | | | | | | | | | | | | |

FIG. 14

|   | 7 | 6 | 5 | 4 | 3 | 2 | 1 | 0 |
|---|---|---|---|---|---|---|---|---|
| 0 | PS | SPF (0b) | PAGE CODE(01h) | | | | | |
| ... | | ... | | | | | | |
| 3 | READ RETRY COUNT | | | | | | | |
| 4 | RC READ RETRY COUNT | | | | RF READ RETRY COUNT | | | |
| 5 | ASYNC READ RETRY COUNT | | | | READ MODE SELECT | | | |
| ... | | ... | | | | | | |
| 10 | (MSB) | RECOVER TIME LIMIT | | | | | | ... |
| 11 | | | | | | | | (LSB) |

Performance - valued     RAID5
There is redundancy     Number of blocked FMPKs:1

Retry count                                    [ 1 ]
Retry count upon reclamation                   [ 3 ]
Retry count upon refresh                       [ 4 ]
Retry count upon asynchronous reading          [ 7 ]

<<Back  <<Cancel             Next>>

FIG. 19

| # | Attribute | Value |
|---|---|---|
| 1 | READ RETRY COUNT | 3 |
| 2 | RC READ RETRY COUNT | 3 |
| 3 | RF READ RETRY COUNT | 7 |
| 4 | ASYNC READ RETRY COUNT | 7 |
| 5 | RECOVERY TIME LIMIT | 2000 |
| ... | ... | ... |

RAID management table 254

| RG# | RAID level | FMPK# | | | | | |
|---|---|---|---|---|---|---|---|
| | | 0 | 1 | 2 | 3 | 4 | .... |
| 0 | RAID5 | 0-0 | 0-1 | 0-2 | 0-3 | 0-4 | .... |
| 1 | RAID6 | 1-1 | 1-2 | 1-3 | 1-4 | 1-5 | .... |

FIG. 21

Blockage management table 255

| RG# | Number of blocked PDEVs | #0 | #1 | #2 | #3 | #4 | .... |
|---|---|---|---|---|---|---|---|
| 0 | 1 | Normal | Normal | Blockage | Normal | Normal | .... |
| 1 | 2 | Normal | Normal | Normal | Blockage | Blockage | .... |

FIG. 22

|   | 7 | 6 | 5 | 4 | 3 | 2 | 1 | 0 |
|---|---|---|---|---|---|---|---|---|
| 0 | Valid | Response Code | | | | | | |
| 1 | Segment number | | | | | | | |
| 2 | Filemark | EOM | ILI | Reserved | Sense key = 01H | | | |
| 3-6 | Information | | | | | | | |
| 7 | Additional sense length | | | | | | | |
| 8-11 | Command specific information | | | | | | | |
| 12 | Additional sense code = 11H | | | | | | | |
| 13 | Additional sense qualifier = 01H | | | | | | | |
| 14 | File replaceable unit code | | | | | | | |
| 15 | SKSV | Sense key specific | | | | | | |
| 16 | Sense key specific | | | | | | | |
| 17 | Sense key specific | | | | | | | |
| 18 | Additional sense byte | | | | | | | |

FIG. 23

|   | 7 | 6 | 5 | 4 | 3 | 2 | 1 | 0 |
|---|---|---|---|---|---|---|---|---|
| 0 | OPERATTION CODE (28h) | | | | | | | |
| 1 | RDPROTECT | | | DPO | FUA | Reserved | FUA NV | Obsolete |
| 2 | LOGICAL BLOCK ADDRESS | | | | | | | |
| 3 | | | | | | | | |
| 4 | | | | | | | | |
| 5 | | | | | | | | |
| 6 | Reserved | | | | GROUP NUMBER | | | |
| 7 | TRANSFER LENGTH | | | | | | | |
| 8 | | | | | | | | |
| 9 | READ MODE SELECT | | | | Reserved | NACA | Obsolete | Obsolete |

| Special \ Mode | (1) | (2) | (3) | (4) |
|---|---|---|---|---|
| (1) | (1) | (1) | (1) | (1) |
| (2) | (2) | (2) | (2) | (2) |
| (3) | (3) | (3) | (3) | (3) |
| (4) | (4) | (4) | (4) | (4) |

(1): First value (first read mode)
(2): Second value (second read mode)
(3): Third value (third read mode)
(4): Fourth value (fourth read mode)

| RAID level \ Number of blocked PDEVs | Zero | One | Two |
|---|---|---|---|
| RAID6 | No | No | Yes |
| RAID5 | No | Yes | - |
| .... | .... | .... | .... |

Comparative example

| Read type |
|---|
| Bus# |
| CE# |
| Die# |
| BLOCK# |
| Page# |
| Read option# |
| ... |
| Next pointer |

FIG. 34

3500 Enqueue destination determination table

| BUS# | CE# | Read option# | Enqueue destination | Number of commands |
|---|---|---|---|---|
| 0 | 0 | 0 | Destination indicated by TAIL of read command queue of read option #0 | 128 |
| | | 1 | Destination indicated by TAIL of read command queue of read option #1 | 50 |
| | | 2 | Destination indicated by TAIL of read command queue of read option #2 | 10 |
| | | 3 | Destination indicated by TAIL of read command queue of read option #3 | 1 |
| | | 4 | Destination indicated by TAIL of read command queue of read option #4 | 0 |
| | | .... | .... | .... |
| | L-1 | .... | .... | .... |
| .... | .... | .... | .... | .... |
| J-1 | .... | .... | .... | .... |

FIG. 35

3600 First execution limitation table

| Number of execution queue RD commands | Maximum number of continuous execution commands per CE | | | | | | | |
|---|---|---|---|---|---|---|---|---|
| | Read option# | | | | | | | |
| | 1 | 2 | 3 | 4 | 5 | 6 | 7 | 8 |
| .... | .... | .... | .... | .... | .... | .... | .... | .... |
| 2,048 | 8 | 4 | 3 | 2 | 2 | 1 | 1 | 1 |
| .... | .... | .... | .... | .... | .... | .... | .... | .... |
| 1,024 | 16 | 8 | 5 | 4 | 3 | 2 | 2 | 2 |
| .... | .... | .... | .... | .... | .... | .... | .... | .... |
| 2 | 1 | 1 | - | - | - | - | - | - |
| 1 | 1 | - | - | - | - | - | - | - |

FIG. 36

3700 Unit value table

| Option# | RD response performance unit value |
|---|---|
| 0 | 53 |
| 1 | 53 |
| 2 | 53 |
| 3 | 53 |
| 4 | 106 |
| .... | .... |

FIG. 37

3800 Second execution limitation table

| Number of execution queue RD commands | Maximum response performance per CE | | | | | | | |
|---|---|---|---|---|---|---|---|---|
| | Read option# | | | | | | | |
| | 1 | 2 | 3 | 4 | 5 | 6 | 7 | 8 |
| .... | .... | .... | .... | .... | .... | .... | .... | .... |
| 2,048 | 1272 | 318 | 212 | 159 | 106 | 106 | 106 | 106 |
| .... | .... | .... | .... | .... | .... | .... | .... | .... |
| 1,024 | 1272 | 636 | 424 | 318 | 212 | 212 | 159 | 159 |
| .... | .... | .... | .... | .... | .... | .... | .... | .... |
| 2 | 1272 | 636 | .... | .... | .... | .... | .... | .... |
| 1 | 1272 | .... | .... | .... | .... | .... | .... | .... |

FIG. 38

3900 Cumulative counter table

| CE# / BUS# | #0 | #1 | #2 | #3 | #4 | .... | #L-1 |
|---|---|---|---|---|---|---|---|
| #0 | | | | | | | |
| .... | | | | | | | |
| #K-1 | | | | | | | .... |

FIG. 41

Environment/option simple management information 4501

| Bus# | CE# | Die# | Optimal read option |
|---|---|---|---|
| BUS#0 | CE#0 | Die#0 | |
| | | Die#1 | |
| | : | : | : |
| | CE#15 | Die#0 | |
| | | Die#1 | |
| : | : | : | : |
| BUS#31 | CE#0 | Die#0 | |
| | | Die#1 | |
| | : | : | : |
| | CE#15 | Die#0 | |
| | | Die#1 | |

FIG. 42

| | Number of trials | | | | | | |
|---|---|---|---|---|---|---|---|
| Start option | 1 | 2 | 3 | 4 | 5 | 6 | 7 |
| #0 | #1 | #2 | #3 | #4 | #5 | #6 | #7 |
| #1 | #0 | #2 | #3 | #4 | #5 | #6 | #7 |
| #2 | #0 | #1 | #3 | #4 | #5 | #6 | #7 |
| #3 | #0 | #1 | #2 | #4 | #5 | #6 | #7 |
| #4 | #0 | #1 | #2 | #3 | #5 | #6 | #7 |
| #5 | #0 | #1 | #2 | #3 | #4 | #6 | #7 |
| #6 | #0 | #1 | #2 | #3 | #4 | #5 | #7 |
| #7 | #0 | #1 | #2 | #3 | #4 | #5 | #6 |

NON-VOLATILE MEMORY DEVICE, AND STORAGE APPARATUS TO REDUCE A READ RETRY OCCURRENCE FREQUENCY AND PREVENT READ PERFORMANCE FROM LOWERING

TECHNICAL FIELD

This invention generally relates to read of data from a non-volatile memory.

BACKGROUND ART

For example, a flash memory device including a plurality of chips (flash memory chips) is known as a non-volatile memory device. Miniaturizing chips tend to increase an error occurrence rate and therefore a read retry frequency tends to become high. PTL 1 discloses a technique related to a read retry. According to PTL 1, a reference value of a read retry count is configured per chip. When the read retry count of a read source chip does not exceed the reference value, normal read is performed and, when a read retry count of a read source chip exceeds the reference value, retry read is performed at a voltage Vth at which read can be performed at a previous read retry. Upon a read retry, a read option (e.g. a number) is selected. The flash memory device performs read using a selected read option (strictly speaking, according to a read method matching the selected read option). The read method includes, for example, changing the voltage Vth. When a read retry is not performed, a read option which means that a read retry is not performed may be selected according to a read command.

CITATION LIST

Patent Literature

[PTL 1] US 2011/0066899

SUMMARY OF INVENTION

Technical Problem

When a read retry is repeatedly performed, read performance lowers. According to PTL 1, when a read retry count of a read source chip exceeds the reference value, a read retry is performed using a read option which enables read upon a previous read retry. However, even if a read retry is performed using the previous read option when the read retry count exceeds the reference value, the read retry does not necessarily succeed.

A problem of this type is also likely to occur in non-volatile memory devices other than flash memory devices.

Solution to Problem

A non-volatile memory device includes a non-volatile memory and a memory controller which executes read from the non-volatile memory using a read option. The non-volatile memory includes a plurality of memory area units (e.g. dies described below), and each memory area unit includes a plurality of memory areas (e.g. physical pages). The memory controller holds management information in which a read option is recorded per memory area unit which is a unit larger than a memory area which is a read unit. The memory controller specifies a memory area unit including a read source memory area, selects a read option matching the specified memory area unit, and executes read from the read source memory area using the selected read option.

Advantageous Effects of Invention

A read option matching a memory area unit including a read source memory area in a non-volatile memory is selected, and read is executed using the selected read option. Consequently, it is possible to reduce a read retry occurrence frequency and, as a result, prevent read performance from lowering.

BRIEF DESCRIPTION OF DRAWINGS

FIG. 6 shows a configuration of read success count management information 452.
FIG. 10 shows details of processing in S901 in FIG. 9.
FIG. 11 shows an example of a condition determination rule.
FIG. 12 shows details of processing in S906 in FIG. 9.
FIG. 13 shows a configuration of a configuration table 256.
FIG. 14 shows a configuration of a command used to configure a RR threshold.
FIG. 15 shows a RR threshold configuration screen.
FIG. 19 shows a configuration of flash device configuration information 443.
FIG. 20 shows a configuration of a RAID management table 254.
FIG. 21 shows a configuration of a blockage management table 255.
FIG. 22 shows an example of a check response.
FIG. 23 shows an example of a special read request.

FIG. 34 shows a configuration of an enqueue destination determination table.

FIG. 35 shows a configuration of a first execution limitation table 3600.

FIG. 36 shows a configuration of a unit value table 3700.

FIG. 37 shows a configuration of a second execution limitation table 3800.

FIG. 38 shows a configuration of a cumulative counter table 3900.

FIG. 41 shows configuration environment/option simple management information 4501.

FIG. 42 shows a read option switch rule according to Embodiment 2.

DESCRIPTION OF EMBODIMENTS

Some embodiments will be described below with reference to the drawings.

In addition, various pieces of information will be described using expressions such as a "kkk table" or a "kkk queue" below. However, the various pieces of information may be expressed as a data structure other than the table. At least one of the "kkk table" and the "kkk queue" can be referred to as "kkk information" to indicate that there is no dependency on a data structure.

Further, identification numbers are used as various pieces of target identification information in the following explanation. However, identification information (e.g. identifiers including alphabets or symbols) of a type other than an identification number can also be adopted.

Furthermore, processing will be described using a "program" as a subject below. However, the program is executed by a processor (e.g. a CPU (Central Processing Unit)) to perform predetermined processing optionally using storage resources (e.g. a memory) and/or a communication interface device (e.g. a communication port). Therefore, a subject of processing may be a processor (or an apparatus such as a controller including this processor). By contrast with this, it can be interpreted that processing whose subject is a processor (or an apparatus such as a controller including this processor) is performed by executing one or more programs. Further, the processor may include a hardware circuit which performs part or entirety of processing performed by the processor. A computer program may be installed in each computer from a program source. The program source may be, for example, a program distribution server or a storage medium.

Further, a communication interface device is abbreviated as an "I/F" in the following explanation.

Furthermore, a flash memory device (a flash memory package is abbreviated as a "FMPK" below) including a flash memory is used as an example of a non-volatile memory device including a non-volatile memory in the following explanation. However, instead of a flash memory device, non-volatile memory devices including other types of non-volatile memories (e.g. semiconductor memories such as a MRAM (Magnetoresistive Random Access Memory), a ReRAM (Resistance Random Access Memory) and a FeRAM (Ferroelectric Random Access Memory)) may be adopted.

Further, the FMPK receives a command from an upper apparatus and executes processing. However, a read command of commands received from the upper apparatus will be referred to as a "read request" and a write command will be referred to as a "write request" below. Meanwhile, a read command issued in the FMPK will be referred to as a "read command", and a write command will be referred to as a "write command".

Embodiment 1

Figure 1:
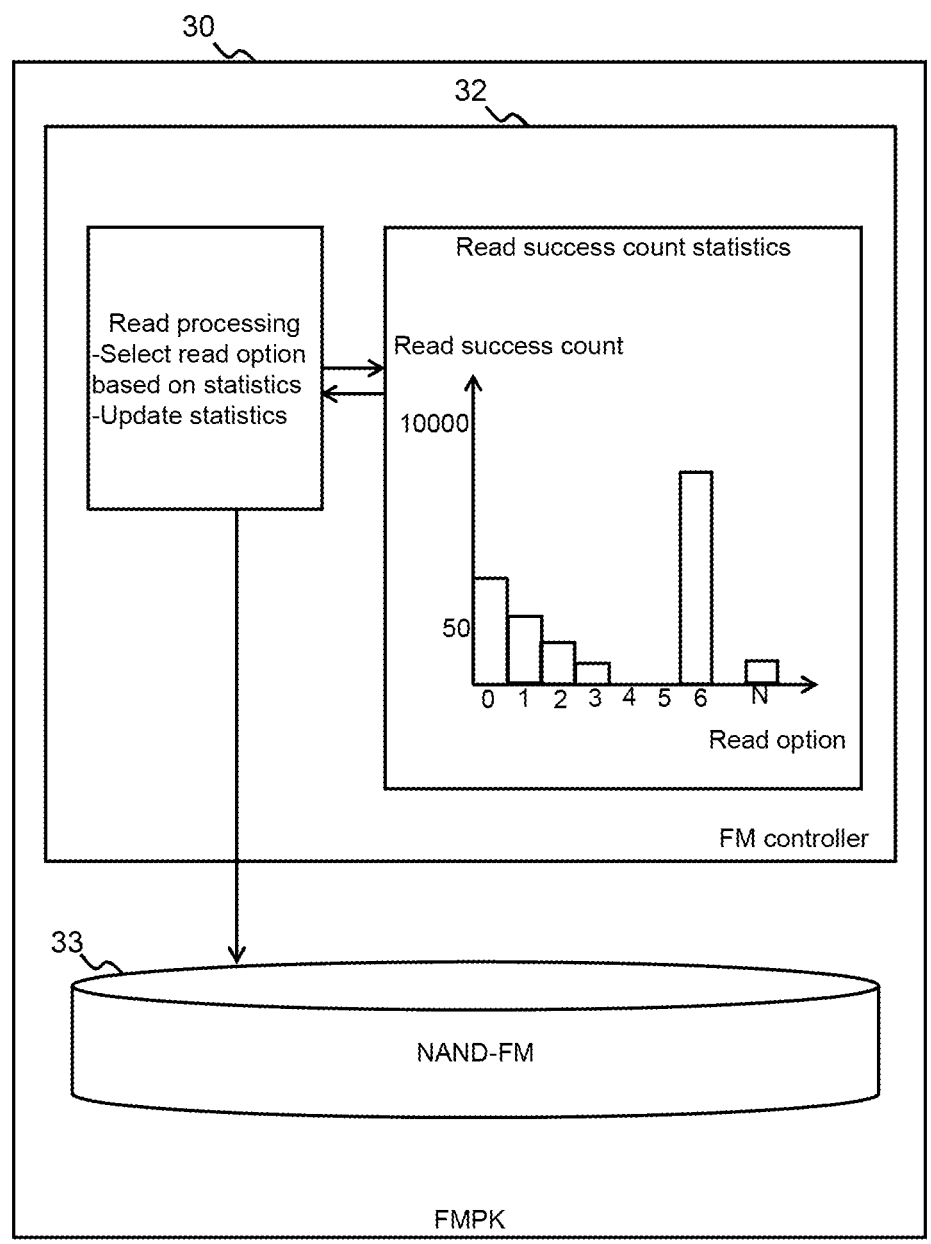
FIG. 1 schematically shows Embodiment 1.

FIG. 1 schematically shows Embodiment 1.

A flash memory package (referred to as a FMPK below) 30 includes a NAND flash memory (referred to as a NAND-FM below) 33 and a flash memory controller (referred to as a FM controller below) 32 coupled to the NAND-FM 33. The FM controller 32 performs read processing as part of internal processing performed in response to a read request from an upper apparatus (not shown) of the FMPK 30 or irrespectively of (out of synchronization with) commands from the upper apparatus. When executing the read processing in response to the read request from the upper apparatus, the FM controller 32 transmits to the upper apparatus a response including data read by this read processing (a response including read target data according to the read request).

The FM controller 32 performs read from the NAND-FM 33 using a read option in the read processing. The FM controller 32 manages read success count statistics (e.g. information indicating a relationship between a read option and a read success count) per read environment, and can update the read success count statistics every time read succeeds. Read environment is defined by a combination of attribute values of a plurality of (or one) read influence attributes (attributes defined as attributes which influence whether or not read succeeds). In addition, in this embodiment, "success of read" means that all error bits of read data can be corrected (e.g. the error bits can be corrected by an ECC (Error Correcting Code). "Failure of read" means that data cannot be read (i.e., data includes a great amount of error bits to such a degree that all error bits of read data cannot be corrected).

The FM controller 32 selects a plausible read option (typically, a read option matching a maximum read success count) from the read success count statistics matching read environment to which a read source area belongs upon read from the NAND-FM 33, and executes read using the selected read option.

Thus, the FM controller 32 selects in advance a plausible read option based on the read success count statistics of read environment to which the read source area belongs every time read from the NAND-FM 33 is performed, and executes read using the selected read option. Consequently, it is possible to reduce a read retry occurrence frequency and, as a result, prevent read performance from lowering.

This embodiment will be described in detail below.

Figure 2:
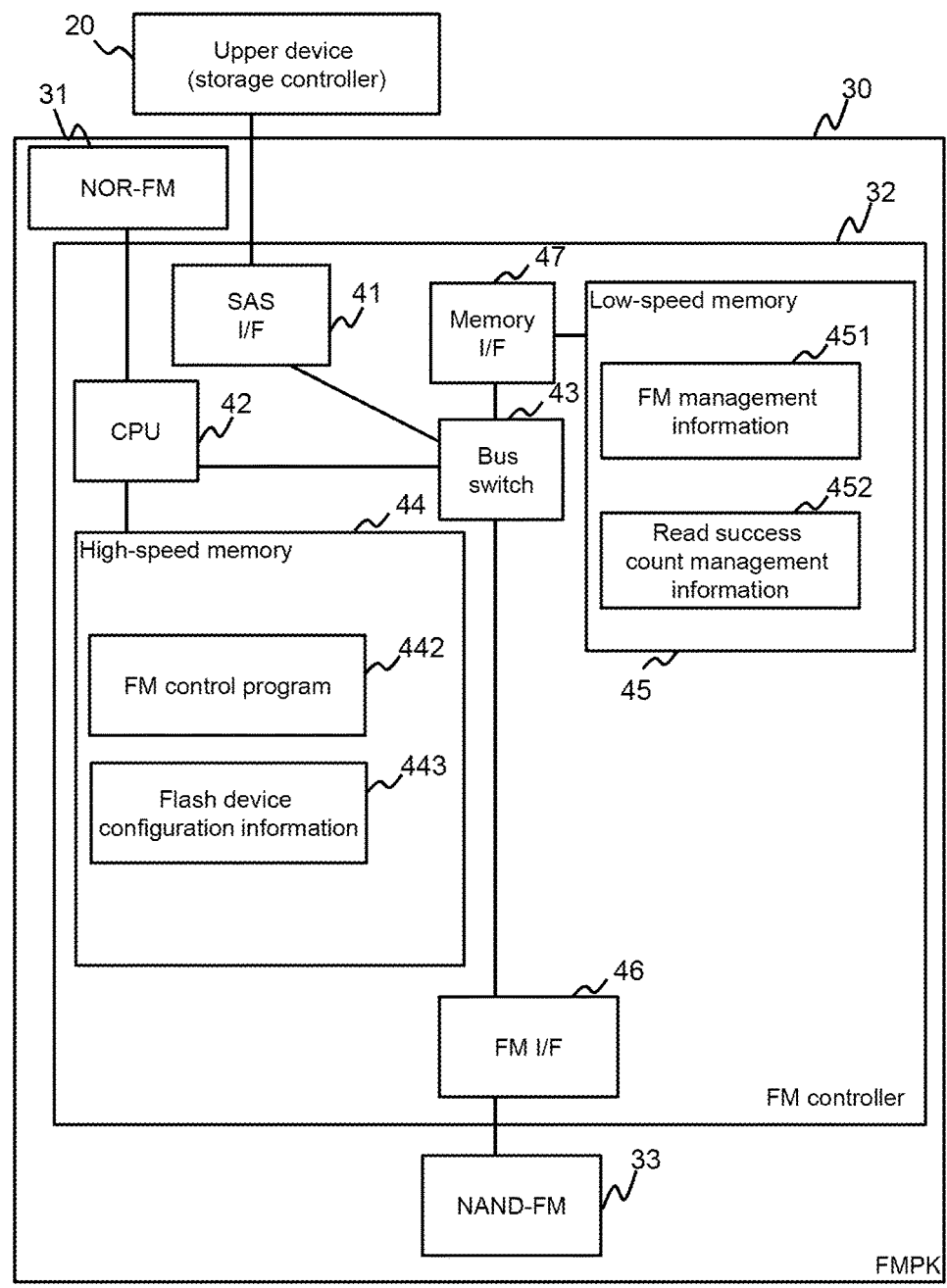
FIG. 2 shows a configuration example of a FMPK 30.

FIG. 2 shows a configuration example of the FMPK 30.

The FMPK 30 has a NOR flash memory (referred to as a NOR-FM below) 31, the FM controller 32 and the NAND-FM 33.

The NOR-FM 31 stores at least one of a program executed by a CPU 42 and information used by the CPU 42. The NAND-FM 33 includes one or more NAND-FM chips. The NAND-FM chip may be a SLC (Single level Cell) type or a MLC (Multi Level Cell) type. In the NAND-FM 33, data is stored according to a write command issued by the FM controller 32 which receives a write request from an upper apparatus 20.

The FM controller 32 has the CPU 42, a SAS (Serial Attached SCSI) I/F 41, a bus switch 43, a memory I/F 47, a low-speed memory 45, a high-speed memory 44 and a FM I/F 46.

The SAS I/F 41 is a communication interface device coupled to the upper apparatus 20, and mediates data communication between the upper apparatus 20 and a unit on the bus switch 43 side. The SAS I/F 41 performs data communication with the upper apparatus 20 according to a SAS. The upper apparatus 20 is a storage controller as described below. However, the upper apparatus 20 may be a computer such as a PC (Personal Computer) instead of a storage controller.

The bus switch 43 is coupled to the CPU 42, the SAS I/F 41, the memory I/F 47 and the FM I/F 46, and relays data between these units.

The memory I/F 47 is a communication interface device coupled to the low-speed memory 45, and controls an input and an output of data to and from the low-speed memory 45.

The low-speed memory 45 is, for example, a DRAM (Dynamic Random Access Memory) or a non-volatile memory, and stores various items of data and the like used for processing performed by the CPU 42. The low-speed memory 45 stores FM (flash memory) management information 451 and read success count management information 452.

The FM management information 451 stores information required to manage the NAND-FM 33. The read success count management information 452 is configured and referred to by a flash memory control program 442, and holds the number of times of success of read based on a management unit in the FMPK 30. The management unit in the FMPK 30 will be described.

The high-speed memory 44 is, for example, a SRAM (Static Random Access Memory) and is directly coupled to the CPU 42. The high-speed memory 44 stores programs and the like executed by the CPU 42. In this embodiment, the high-speed memory 44 stores the flash memory control program (referred to as a FM control program below) 442, and flash device configuration information 443. The FM control program 442 performs control of receiving and executing commands from the upper apparatus 20. Further, the FM control program 442 executes various types of processing related to the NAND-FM 33. The flash device configuration information 443 includes mode parameters and a RR threshold (read retry count threshold) configured by the CPU 42 in response to an indication from the upper apparatus (storage controller) 20.

The FM I/F 46 is a communication interface device coupled to the NAND-FM 33, and controls an input and an output of data to and from the NAND-FM 33.

The configuration of the FMPK 30 is not limited to the configuration shown in FIG. 2. For example, the NOR-FM 31 may not be provided, and a program or information in the NOR-FM 31 may be stored in at least one of the high-speed memory 44 and the low-speed memory 45. Further, one or more memories having the same performance may be adopted instead of a plurality of memories having different performances such as the high-speed memory 44 and the low-speed memory 45.

Figure 3:
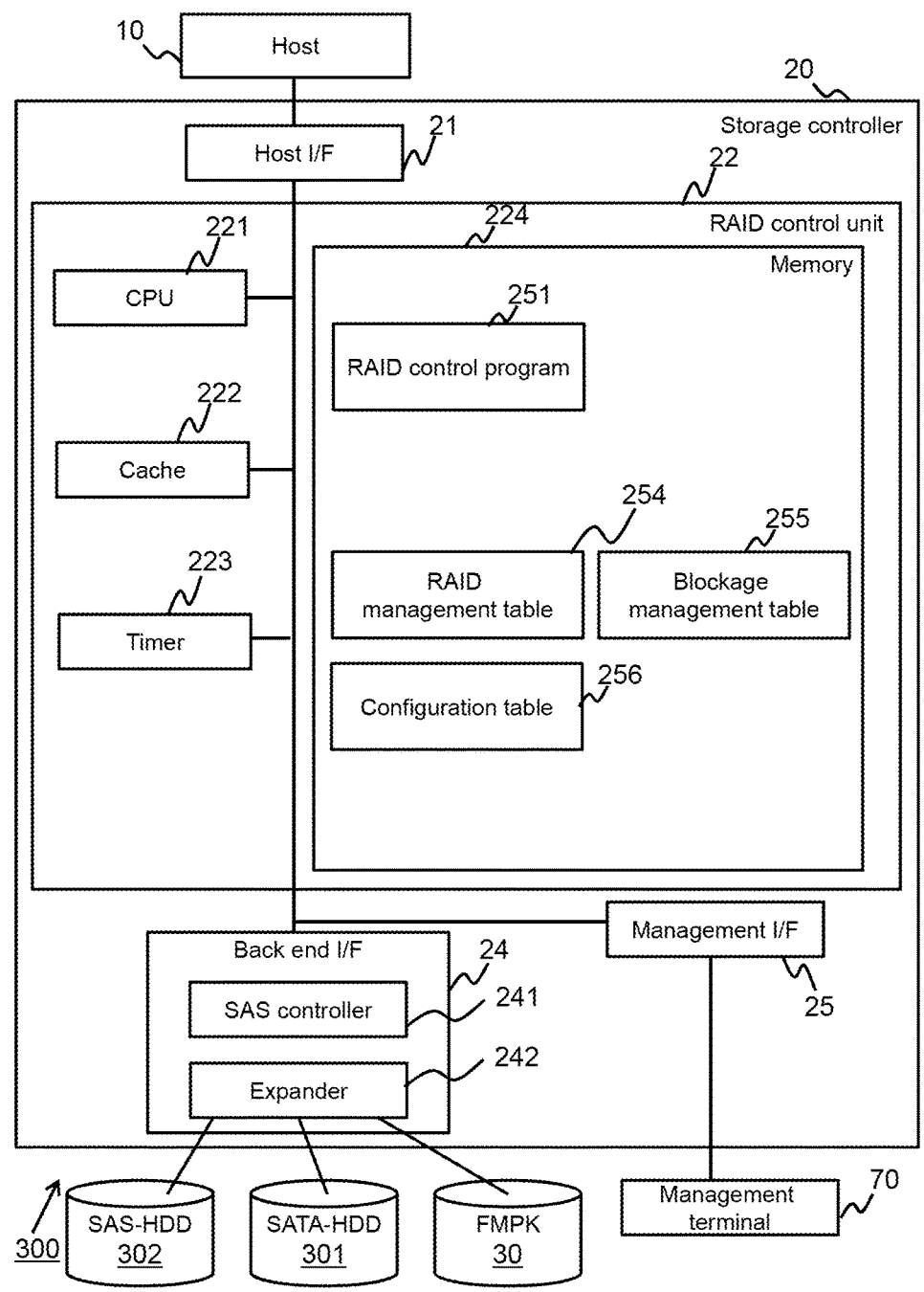
FIG. 3 shows a configuration example of a storage apparatus according to Embodiment 1.

FIG. 3 shows a configuration example of a storage apparatus according to Embodiment 1.

A storage apparatus 300 has the storage controller 20 which is an example of the upper apparatus 20, the FMPK 30, a SAS-HDD 302 and a SATA (Serial ATA)-HDD 301. The number of at least one of the FMPK 30, the SAS HDD 302 and the SATA-HDD 301 may be one or more. In this embodiment, there are a RAID (Redundant Array of Independent (or Inexpensive) Disks) group including a plurality of FMPKs 30, a RAID group including a plurality of SAS-HDDs 302 and a RAID group including a plurality of SATA-HDDs 301.

The storage controller 20 includes a host I/F 21, a RAID control unit 22, a management I/F 25 and a back end interface device (back end I/F) 24.

The host I/F 21 is a communication interface device which mediates an exchange of data between a host computer (referred to as a host below) 10 and the storage controller 20. The host 10 inputs and outputs data used for processing, to and from the storage controller 20.

The management I/F 25 is a communication interface device which mediates an exchange of data to and from a management terminal 70. The management terminal 70 is a computer, and has an input unit (e.g. a keyboard and a pointing device) (not shown) which receives an input from an administrator, and an output unit (e.g. a display device) (not shown) which outputs information (typically, an indication) to the administrator.

The back end I/F 24 mediates an exchange of data between PDEVs such as the FMPK 30, the SAS-HDD 302 and the SATA-HDD 301. The back end I/F 24 has a SAS controller 241 and a SAS expander (referred to as an expander below) 242. The expander 242 is an example of a switch device, can be coupled to a plurality of PDEVs (30, 301 and 302) and mediates an exchange of data between the SAS controller 241 and the PDEV. The SAS controller 241 performs data communication to and from the PDEV according to the SAS.

The RAID control unit 22 controls an access from the host 10 to the PDEV. The RAID control unit 22 has a CPU 221, a cache memory 222, a timer 223 and a memory 224. The cache memory 222 caches data to be inputted to and outputted from the PDEV. The timer 223 measures a time which passes. The CPU 221 executes various types of processing using programs and data stored in the memory 224.

The memory 224 stores the programs executed by the CPU 221 and data used by the CPU 221. More specifically, the memory 224 stores a RAID control program 251, a RAID management table 254, a blockage management table 255 and a configuration table 256.

The RAID control program 251 performs RAID control on RAID groups based on the RAID management table 254. Further, the RAID control program 251 refers to the blockage management table 255, and notifies a retry count matching the number of blocked FMPKs 30, to the FMPKs 30 which form a RAID group when there is the RAID group including the blocked FMPKs 30. Furthermore, the RAID control program 251 performs communication with the management terminal 70. Still further, the RAID control program 251 configures a retry count limitation parameter of the FMPK 30 according to definition of a system operation. Moreover, the RAID control program 251 receives a command issue request from the RAID control program 251, and issues a command to the FMPK 30 through the back end I/F 24 according to this request.

The RAID management table 254 is a table which includes information related to configurations of the RAID groups. The blockage management table 255 is a table which includes information indicating states of the FMPKs 30 (such as normal or blocked) which form the RAID group. The configuration table 256 is a table which includes numerical values (e.g. retry counts) for determining an operation of the storage controller 20.

In this embodiment, the storage controller 20 and the PDEVs perform communication according to a SAS protocol. However, the storage controller and the PDEVs may perform communication with each other according to a protocol (e.g. PCIe (PCI-Express)) other than the SAS.

Figure 4:
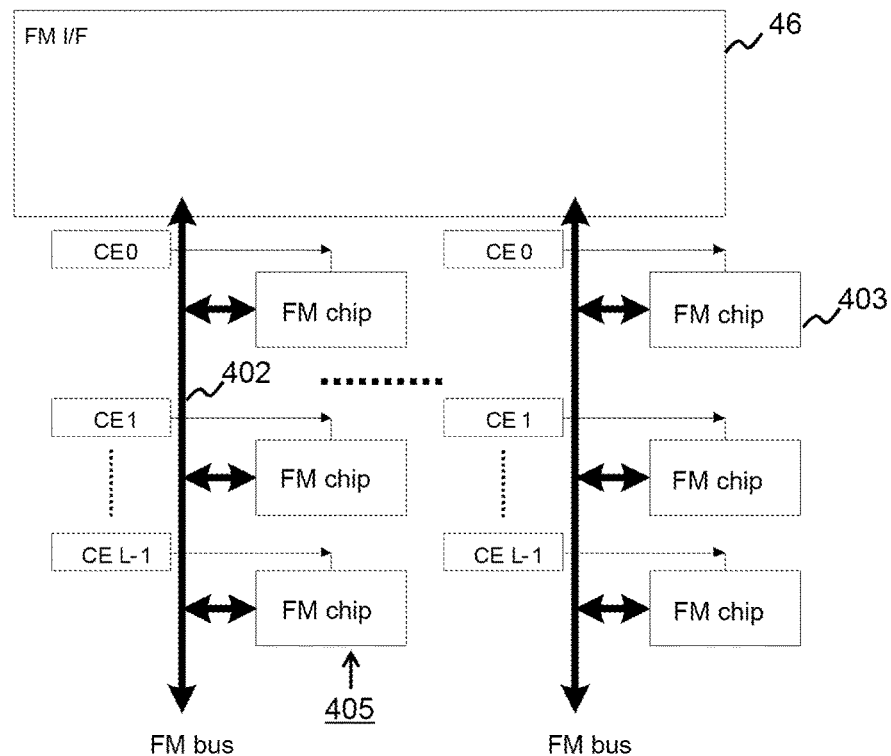
FIG. 4 shows coupling between a FM I/F 46 and a NAND-FM 33.

FIG. 4 shows coupling between the FM I/F 46 and the NAND-FM 33.

The NAND-FM 33 includes a plurality of NAND-FM chips (referred to as FM chips below) 403.

A plurality of flash memory access buses (referred to as FM buses below) 402 is coupled to the FM I/F 46. A plurality of FM chip groups 405 is coupled to a plurality of FM buses 402, respectively. Each FM chip group 405 includes two or more (or one) FM chips 403. A plurality of FM chips 403 coupled to a plurality of different FM buses 402 is coupled to the same CE (chip enable) line. It is possible to enable dies according to CE signals flowing in the CE line.

The FM I/F 46 can access the desired FM chip 403 by selecting a FM bus number and a CE line number.

Figure 5:
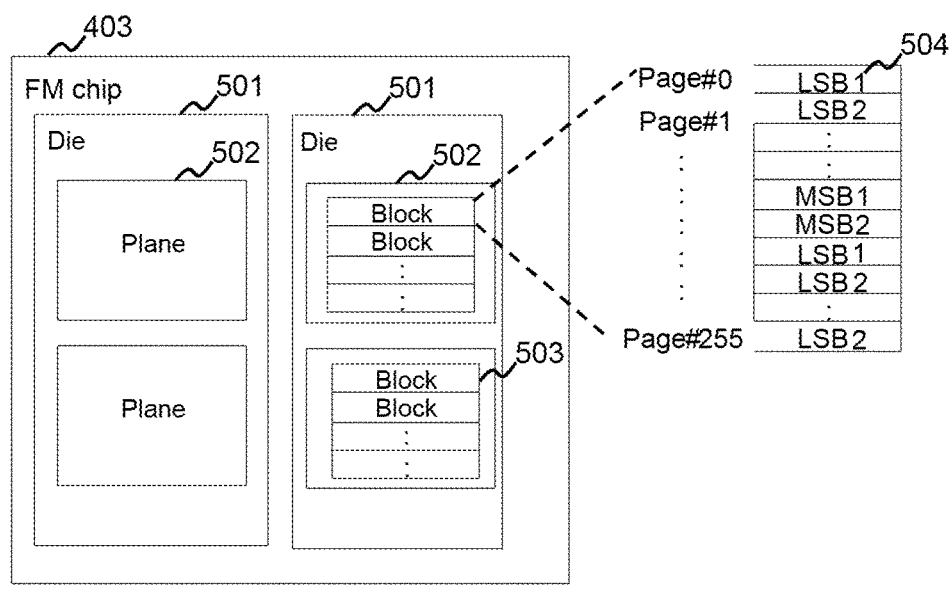
FIG. 5 shows a configuration of a FM chip 403.

FIG. 5 shows a configuration of the FM chip 403.

The FM chip 403 includes first and second dies 501. Each die 501 includes first and second planes 502. Each plane 502 includes a plurality of blocks (physical blocks) 503, and each block 503 includes a plurality of pages (physical pages) 504. In the FM chip 403, data is inputted and outputted in page units, and data is erased in block units. The first plane 502 may include odd-numbered blocks (blocks of odd number), and the second plane 502 may include even-numbered blocks (blocks of even numbers).

Each page 504 is one of four types of two types of LSB (Least Significant bit/byte) pages (LSB1 page and LSB2 page) and two types of MSB (Most Significant bit/byte) pages (MSB1 page and MSB2 page) such that each block 503 includes the four types of the pages. The block configuration in FIG. 5 is an exemplary configuration, and the block configuration may depend on at least one of a chip and a manufacturer. The number of types of pages of LSB pages may be one or three or more, and, similarly, the number of types of MSB pages may be one or three or more.

In addition, in this embodiment, a FM chip, a die, a plane, a block and a page are each one management unit of the NAND-FM 33. At least one of the number of dies of one FM chip 403 and the number of planes of each die is not limited to the above. Further, management units such as dies and planes are not necessarily required.

FIG. 6 shows a configuration of the read success count management information 452.

The read success count management information 452 includes a success counter per read option for each of a plurality of read environments. The success counter indicates the number of times of success of read (read from the NAND-FM 33) using read environment and a read option matching this success counter.

The "read environment" is defined as a plurality of attribute values matching a plurality of (or one) read influence attributes, respectively.

The "read influence attribute" is an attribute defined as an attribute which influences whether or not read succeeds. A read influence attribute is, for example, a PE count (a data erasure count), an elapsed time (a time passed after data is written in a top page of a block), a FM bus number (indicating through which FM bus read is performed), a CE number (indicating through which CE line a FM chip is selected to perform read), a die number (indicating from which die 501 read is performed), a plane number (indicating from which plane 502 read is performed) and a page type (indicating from which page corresponding to which page type read is performed). When a page type (MSB/LSB) is different, page characteristics are generally different, and, therefore, a difference in a page type influences whether or not read succeeds. Further, a difference in a PE count, an elapsed time, a FM bus, a CE line, a die and a plane (an even-numbered block or an odd-numbered block) influences whether or not read succeeds. Instead of or in addition to at least one of the read influence attributes shown in FIG. 6, at least one of other types of read influence attributes such as a temperature and a process variation degree may be adopted.

The read success count management information 452 further includes a selected option number, a MAX counter and a MAX option number. The "selected option number" is a number of a read option (configuration option) configured to a device (e.g. the NAND-FM 33) in option management units. The option management units are management units larger than a page which is a data read/write unit and are dies in the example in FIG. 6. Upon read, a configuration option in the option management units to which a read source page of this read belongs is used. Hence, when a read option selected for read is different from a configuration option in the option management units to which the read source page of this read belongs, the configuration option is changed to the selected read option and read is executed using the changed configuration option. The option management units may be any management units as long as the option management units are management units larger than data read/write units. The "MAX counter" is a maximum value among two or more success counters matching two or more predetermined read environments (e.g. two or more read environments whose attribute values of read influence attributes other than read option numbers are the same). The "MAX option number" is a read option number matching a success counter having the same value as that of the MAX counter.

Figure 7:
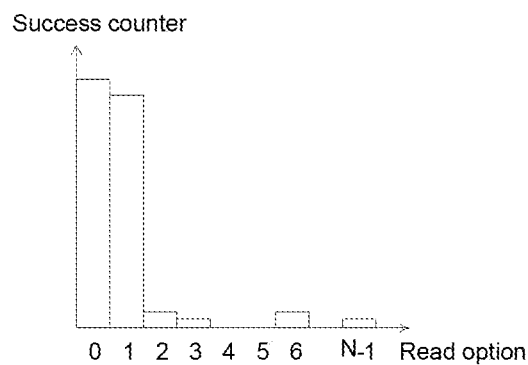
FIG. 7 shows an example of read count success count statistics.

The FM control program 442 selects a read option every time read from the NAND-FM 33 is performed, and executes read according to the selected read option. More specifically, for example, the FM control program 442 specifies read environment to which a read source page belongs, i.e., a PE count range to which a PE count of a read source block (a block including a read source page) belongs, an elapsed time of the read source block, a number of a FM bus coupled to a FM chip including the read source page, a number of a CE line coupled to the FM chip including the read source page, a number of a die including the read source page, a number of a plane including the read source page, and a type of the read source page from the FM management information 451. Further, the FM control program 442 selects a plausible read option from a plurality of read options based on read success count statistics of the specified read environment. The "read success count statistics" is, for example, a relationship between a plurality of read options and a plurality of success counters (values) as shown in FIG. 7. The read success count statistics (i.e. a relationship between a read option and a success counter) differs per read environment. The plausible read option is, for example, a read option matching the highest success counter of the specified read environment.

When read using the read option selected for the specified read environment succeeds, the FM control program 442 adds a value (e.g. adds 1) to the success counter matching this read environment and read option.

When read using the read option selected for the specified read environment fails, the FM control program 442 selects the second plausible read option (e.g. a read option matching the second highest success counter) based on the read success count statistics, and executes read according to the selected read option. This read retry is performed until predetermined conditions (e.g. the read retry count is a predetermined count or less) are not satisfied, and, when the predetermined conditions are not satisfied, processing is finished assuming that an uncorrectable error occurs.

As described above, the FM controller 32 selects a plausible read option in advance based on read success count statistics of read environment to which a read source page belongs (a relationship between a read option and a read success count) every time read from the NAND-FM 33 is performed, and executes read using the selected read option. Consequently, it is possible to reduce a read retry occurrence frequency and, as a result, prevent read performance from lowering. Further, the read success count matching the read option used upon successful read is updated every time read succeeds. Consequently, accuracy of the read success count statistics increases and, therefore, improvement of adequacy of a plausible option selected upon read can be expected.

Figure 8:
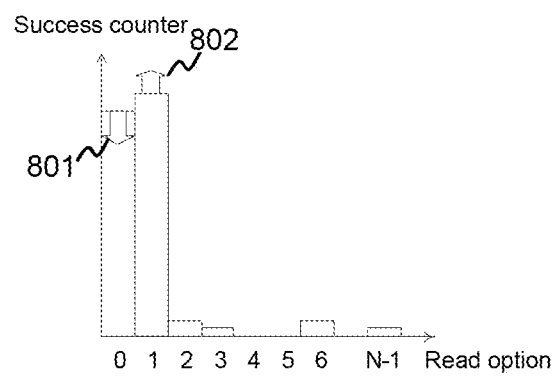
FIG. 8 shows an example of subtraction and addition of a read success count.

In addition, when read using a plausible read option (e.g. read option 0) selected for the specified read environment fails, the FM control program 442 may subtract a value (e.g. subtract 1) from a success counter matching this read option (see reference numeral 801 in FIG. 8). Consequently, it is possible to make a success counter (a selection priority in another point of view) of a read option used for successful read relatively larger. This is because, when read using the second plausible read option (e.g. a read option 1) succeeds, addition to a success counter matching this read option is performed as described above (reference numeral 802 in FIG. 8). Subtraction from a success counter matching a read option upon failure of read may be performed every time read fails or may be performed when a difference between a success counter of a read option upon failure of read and a success counter of the second plausible read option is less than a predetermined value.

Further, read is not limited to normal read (read according to a read request from the storage controller 20). Read may be at least one of other types of read such as reclamation read (read which occurs upon reclamation processing), refresh read (read which occurs upon refresh processing) and asynchronous read. The "asynchronous read" is read which occurs irrespectively of (out of synchronization with) a read request from the storage controller 20. Every read may also be performed by the FM control program 442. The asynchronous read may be, for example, inspection read. According to the inspection read, the number of error bits of read data is detected, and the number of detected error bits is compared with each of one or more predetermined thresholds. The inspection read will be described in detail in Embodiment 2.

Further, the FM management information 451 employs a configuration which can specify read environment of a read source page. More specifically, the FM management information 451 may include per page a PE count (a data erasure count of a block including pages), an elapsed time (an elapsed time passed after data is written in a top page of the block including the pages), a FM bus number (a number of a FM bus coupled to a FM chip including the pages), a CE number (a number of a CE line coupled to the FM chip including the pages), a FM chip number (a number of the FM chip including the pages), a die number (a number of a die including the pages), a plane number (a number of a plane including the pages) and a page type (a type of a page). The FM management information 451 may be updated by the FM control program 442 when the FM control program 442 performs predetermined processing (e.g. data is erased from a block).

Figure 9:
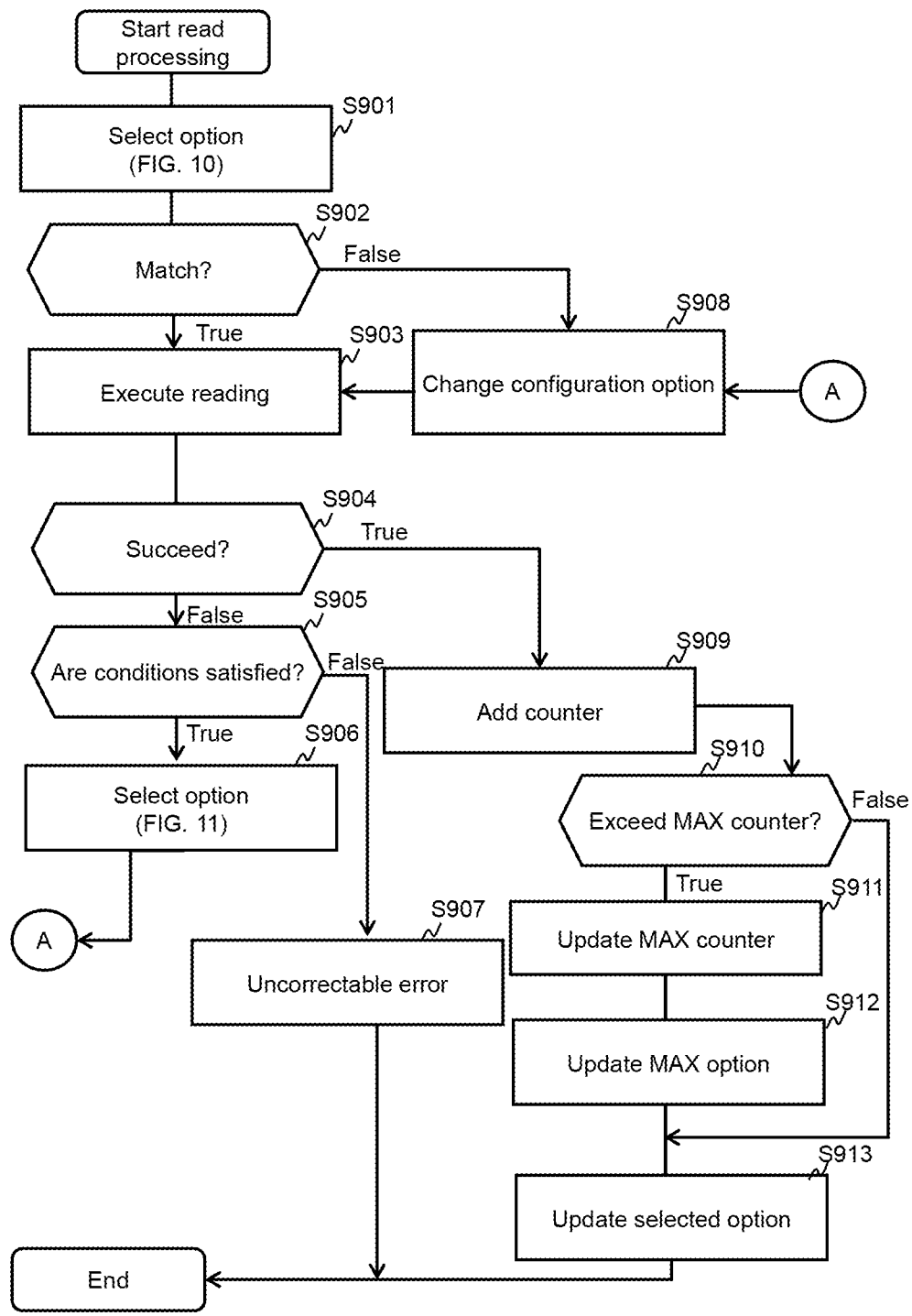
FIG. 9 shows a flow of read processing according to Embodiment 1.

FIG. 9 shows a flow of read processing.

The FM control program 442 specifies read environment (the PE count, the elapsed time, the FM bus number, the CE number, the die number, the plane number and the page type) matching a read source page (e.g. a page allocated to a logical address of a read source), from the FM management information 451, refers to the read success count management information 452 (read success count statistics) using the specified read environment and selects a plausible read option for this read environment (S901). More specifically, for example, as shown in FIG. 10, the FM control program 442 acquires a MAX option matching the specified read environment from the read success count management information 452 (FIG. 10: S1001).

The FM control program 442 determines whether or not the read option number selected in S901 matches with a selected option number matching a die (a die including a read source page) in the specified read environment (S902).

When a determination result in S902 is false (S902: False), the FM control program 442 changes a configuration option of the die including the read source page to the read option selected in S901 (S908).

When the determination result in S902 is true (S902: True) or after S908, the FM control program 442 executes read using the read option selected in S901 (S903). That is, the FM control program 442 transmits a read command for reading data from the page of the read source page using the read option selected in S901, to the FM chip including the read source page, and receives data in the read source page in response to this read command.

The FM control program 442 determines whether or not read succeeds (S904). It may be determined that read succeeds when, for example, data is received from the NAND-FM 33 within a predetermined time after a read command is issued to the NAND-FM 33 and this data is correct.

When the determination result in S904 is false (S904: False), i.e., read fails, the FM control program 442 determines whether or not conditions are satisfied (S905). Whether or not the conditions are satisfied is determined according to a condition determination rule shown in, for example, FIG. 11. According to the rule in FIG. 11, the conditions include (condition: a) that there is an unselected read option, (condition: b) that a read retry (RR) count in this read processing is a RR threshold or less and (condition: c) that a time after a read command is issued for the first time in this read processing is a time limit or less. When all of (condition: a) to (condition: c) are false (i.e., none of (condition: a) to (condition: c) is satisfied), the determination result in S905 is false. Meanwhile, at least one of (condition: a) to (condition: c) is true (i.e. at least one of (condition: a) to (condition: c) is satisfied), the determination result in S905 is true. The reason why the determination result in S905 is configured to be true even when (condition: a) is false (i.e., there is no unselected read option) is that read using the same read option as the read option upon failure of read is likely to succeed when the read is performed again. In addition, the rule shown in FIG. 11 is an example, and a rule that what the determination result in S905 is like when what conditions are satisfied is not limited to the rule shown in FIG. 11. Further, the condition determination rule may be the same as those of all FMPKs 30 in the same RAID group or the condition determination rule may be differ between the FMPKs 30. Furthermore, the above RR threshold and time limit can be configured according to a predetermined command (e.g. a command shown in FIG. 14) from the storage controller 20.

When the determination result in S905 is false (S905: False), the FM control program 442 returns an uncorrectable error as to a read source page (S907), and finishes read processing.

When the determination result in S905 is true (S905: True), the FM control program 442 selects the second plausible read option compared to the read option previously selected (S901 or S906) in this read processing (S906), changes the configuration option to the read option selected in S906 (S908) and executes read using the changed configuration option (S903). In addition, more specifically, as shown in FIG. 12, in S906, the FM control program 442 specifies the second highest success counter (the highest success count when there is no second highest success counter) compared to the success counter of the previously selected read option, from the read success count management information 452 (FIG. 12: S1201), and acquires a read option number matching the specified success counter from the read success count management information 452 (FIG. 12: S1202).

When the determination result in S904 is true (S904: True), i.e., when read succeeds, the FM control program 442 adds 1 to the success counter matching the read option (the read option selected in S901 or last S906) upon success of read (S909). The FM control program 442 determines whether or not the success counter after addition exceeds the MAX counter matching the specified read environment (S910).

When the determination result in S910 is true (S910: True), the FM control program 442 updates the MAX counter (the MAX counter of the read success count management information 452) matching the specified read environment to a value of the success counter after addition in S909 (S911), and updates a MAX option number matching the specified read environment to a number of the read option upon success of read (S912).

When the determination result in S910 is false (S910: False) or after S911 and 912, the FM control program 442 updates the selected option number matching the specified read environment to the number of the read option upon success of read (S913). In addition, in S913 in case of S910: True, the FM control program 442 may change a configuration option of a die including a read source page in this read processing, to the MAX option updated in S912.

The read processing has been described above. In addition, in the read processing, when the selected option number matching the specified read environment is the same as the read option number upon success of read, S913 may be skipped. Further, S902 and S908 may not be provided, and S903 may be performed next to S901. Furthermore, in this embodiment, a read option may be optimized under certain conditions without optimizing a read option at all times. When, for example, good conditions are satisfied even if a read option is not optimized, normal read (e.g. read using a specified read option (e.g. option number=0) which means normal read) may be performed at all times. In S901, the FM control program 442 may determine whether or not to perform the processing in FIG. 10 based on whether or not conditions to optimize a read option are satisfied. In case of normal read, when the read option which means normal read is not yet configured to the NAND-FM 33, this read option may be configured in S908.

Meanwhile, there is an unreadable page. The "unreadable page" is a page from which data cannot be read no matter how many times a read retry is performed by switching a read option. When a read retry is repeatedly executed irrespectively of a read source page which is an unreadable page, the time requires unnecessarily, and read performance substantially lowers. Instead of spending a time for a read retry, it is also preferable in some cases that the storage controller 20 recovers data. By contrast with this, it is also preferable in some cases that data is read from a read source page by repeating a read retry as much as possible. A retry count matching these situations preferably differs according to at least one of a RAID level of a RAID group, the number of blocked FMPKs (blocked FMPK) in the RAID group and whether or not there is redundancy. In addition, "whether or not there is redundancy" means that, even when data cannot be read from a RAID group, whether or not the same data can be read from another storage resource (e.g. another RAID group), and means that, for example, whether or not there are an active RAID group (or a storage apparatus 300) and a standby RAID group (or the storage apparatus 300). Information indicating whether or not performance is valued per RAID group, information indicating a RAID level per RAID group (e.g. RAID management table 254), information indicating the number of blocked FMPKs per RAID group (e.g. blockage management table 255) and information indicating whether or not there is redundancy per RAID group are managed by the storage controller 20 which is an upper apparatus of the FMPKs 30.

Then, in this embodiment, the storage controller 20 determines for a RAID group including FMPKs a RR threshold of a FMPK based on whether or not performance is valued, a RAID level, the number of blocked FMPKs and whether or not there is redundancy, and configures the determined RR threshold to this FMPK. Further, the storage controller 20 is configured to change the RR threshold configured to the FMPK, to a RR threshold matching the changed number of blocked devices when the number of blocked devices in the RAID group changes. Consequently, it is possible to change the RR threshold of the FMPK 30 to a more adequate value.

Information which is related to a RR threshold and is managed by the storage controller 20 is the configuration table 256 of the storage controller 20.

FIG. 13 shows a configuration of the configuration table 256.

The configuration table 256 has a normal RR threshold table unit 1301, a reclamation RR threshold table unit 1302, a refresh RR threshold table unit 1303 and an asynchronous RR threshold table unit 1304. The "normal RR threshold" is a RR threshold (a threshold of a read retry count) of normal read, the "reclamation RR threshold" is a RR threshold of reclamation read, the "refresh RR threshold" is a RR threshold of refresh read and the "asynchronous RR threshold" is a RR threshold of asynchronous read. The configuration of each table unit is the same. More specifically, each table unit includes RR thresholds matching whether or not performance is valued, a RAID level, the number of blocked FMPK and whether or not there is redundancy.

In case that, for example, the number of blocked FMPKs reaches a tolerance number in terms of a RAID level and performance-valued is not configured, if there is not redundancy, the normal RR threshold (a threshold of a count to repeat a read retry of normal read by changing a read option) may be a maximum value. The maximum value is, for example, (X–1), and X is the number of read options. In such a case, data needs to be read even if read performance is sacrificed. Meanwhile, even in the same case, when there is redundancy, the normal RR threshold may be less than a maximum value. Similarly, even when the number of blocked FMPKs reaches the tolerance number in terms of a RAID level, if performance-valued is configured, the normal RR threshold may be less than the maximum value. When performance-valued is configured, a RR threshold may be small compared to a case where performance-valued is not configured.

Further, in, for example, the table units 1301 and 1302, a reclamation RR threshold matching performance-valued may be higher than the normal RR threshold matching performance-valued. This is because the reclamation read is read performed in a background where necessary in processing of a write request from the storage controller 20.

Further, in, for example, the table units 1303 and 1304, a RR threshold may be a maximum value irrespectively of any one of whether or not performance is valued, a RAID level, the number of blocked FMPKs and whether or not there is redundancy. This is because the refresh read and the asynchronous read both are read performed in the background irrespectively of (out of synchronization with) a read request (and a write request) from the storage controller 20.

The storage controller 20 determines a normal RR threshold, a reclamation RR threshold, a refresh RR threshold and an asynchronous RR threshold configured to a FMPK based on the configuration table 256, information indicating whether or not performance is valued per RAID group, information indicating a RAID level per RAID group (e.g. the RAID management table 254), information indicating the number of blocked FMPKs per RAID group (e.g. the blockage management table 255) and information indicating whether or not there is redundancy per RAID group, and transmits a command including these determined RR thresholds to this FMPK.

FIG. 14 shows a configuration of a command used to configure a RR threshold.

The command used to configure a RR threshold is, for example, a mode select command according to the SCSI. As long as a configuration of mode parameters of a FMPK can be changed and referred, a command (e.g. a vendor unique command) other than the mode select command may be used.

The mode select command includes, for example, a normal RR threshold (READ RETRY COUNT), a reclamation RR threshold (RC READ RETRY COUNT), a refresh RR threshold (RF READ RETRY COUNT), an asynchronous RR threshold (ASYNC READ RETRY COUNT), a read mode select (READ MODE SELECT) and a time limit (RECOVERY TIME LIMIT). The mode select command may be transmitted prior to transmission of a read command for read processing, and the read mode select is a parameter indicating a read mode selected from a plurality of read modes (a read option selection policy). A value of this parameter may take, for example, four types of a first value (first read mode: a read option is selected based on read success count statistics), a second value (second read mode:

a read option accompanied by performance delay is selected), a third value (third read mode: all read options are sequentially selected (e.g. for dynamic sparing)) and a fourth value (fourth read mode: a fourth default read option is selected). In addition, the "read option accompanied by performance delay" may be a read option which requires a time for read yet supports a read method which is highly likely to succeed in read by special processing inside a chip.

FIG. 15 shows an example of a RR threshold configuration screen.

A RR threshold configuration screen 1500 is a GUI (Graphical User Interface), is provided to the management terminal 70 through the management I/F 25 by a management terminal communication program 252, and is displayed on an output unit (not shown) of the management terminal 70. The administrator can input various RR thresholds to the storage controller 20 of the storage apparatus 300 from the management terminal 70 through the RR threshold configuration screen 1500 based on whether or not performance is valued, a RAID level, whether or not there is redundancy and the number of blocked FMPKs. The inputted various RR thresholds are registered in the configuration table 256 by the management terminal communication program 252.

In addition, the various RR thresholds may be inputted and registered by a method such as an interface of a command format other than a GUI.

Further, whether or not performance is valued may mean whether a performance priority is higher or lower in other words. The performance priority may have multiple levels compared to two levels (higher or lower).

Further, instead of or in addition to a RAID level, other types of RAID configurations (e.g. the number of FMPKs which form a RAID group) may be adopted.

Furthermore, at least one type of a RR threshold among a plurality of types of RR thresholds may be configured in more detailed units. For example, at least one type of a RR threshold may be specified per RAID group or may be specified per logical volume on which a RAID group is based. At least one type of a RR threshold may be configured to one FMPK 30 per logical address range (e.g. a range matching a logical volume). That is, a plurality of RR thresholds of the same type which differ depending on a logical address range may be configured to the FM controller 32 of one FMPK 30. The FM controller 32 may control a read retry count in read processing of a read source page based on a RR threshold matching a logical address range to which a logical address to which the read source page is allocated belongs.

The storage controller 20 transmits to the FMPK 30 a command (e.g. the mode select command shown in FIG. 14) including RR thresholds registered in the configuration table 256, and the FM controller 32 of the FMPK 30 receives this command and stores the RR thresholds in this command. When the storage controller 20 detects from at least one RAID group a change in a value of at least one attribute of whether or not performance is valued, a RAID level, whether or not there is redundancy and the number of blocked FMPKs, the command (mode select command) which specifies a plurality of types of RR thresholds may transmit the mode select command which specifies the RR threshold matching the changed attribute value to the FMPKs 30 which form the RAID group from which the change is detected. An example of a series of a flow of configuring a RR threshold will be described below.

Figure 16:
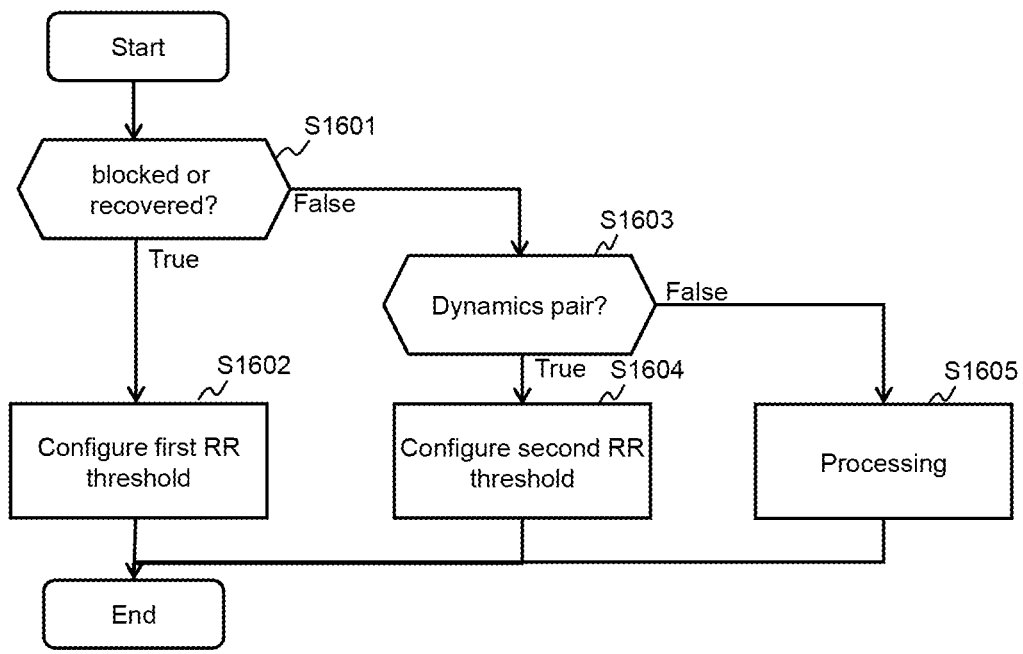
FIG. 16 shows an example of a flow of processing performed by a RAID control program 251.

FIG. 16 shows an example of a flow of processing performed by the RAID control program 251.

When detecting blockage or recovery of the FMPK 30 (S1601: True), the RAID control program 251 executes first RR threshold configuration processing (S1602). In the first RR threshold configuration processing, RR thresholds matching a RAID level, the number of blocked FMPKs, whether or not performance is valued and whether or not there is redundancy in the RAID group including the blocked or recovered FMPKs 30 are configured to each FMPK 30 of the RAID group including the blocked or recovered FMPKs 30.

When performing dynamic sparing on the RAID group (S1601: False and S1603: True), the RAID control program 251 executes second RR threshold configuration processing (S1604). In the second RR threshold configuration processing, a command including a RR threshold (e.g. a maximum value of a read retry count) used upon dynamic sparing is transmitted to each FMPK 30 of the RAID group on which dynamic sparing is performed, and a RR threshold used upon dynamic sparing is configured to each FMPK 30 of this RAID group.

When detecting blockage or recovery of the FMPK 30 and when performing processing other than dynamic sparing (S1601: False and S1603: False), the RAID control program 251 performs some necessary processing other than the first and second RR threshold configuration processing (S1605). When processing does not need to be performed in particular, S1605 may be skipped.

Figure 17:
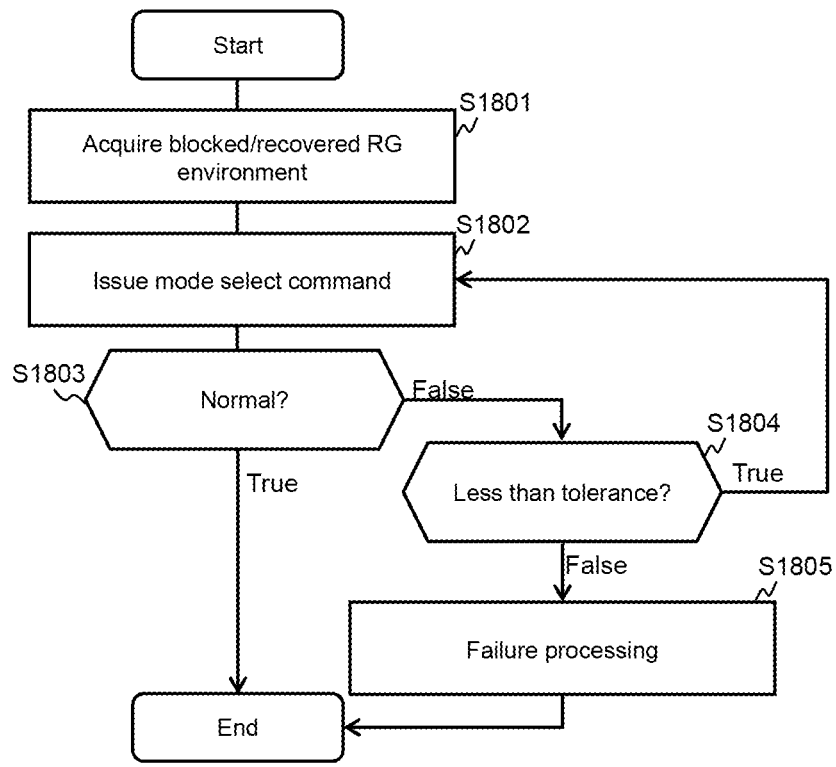
FIG. 17 shows a flow of first RR threshold configuration processing.

FIG. 17 shows a flow of the first RR threshold configuration processing.

The RAID control program 251 specifies blockage/recovery RG environment (more specifically, a RAID level, the number of blocked FMPKs, whether or not performance is valued and whether or not there is redundancy) which is environment to which the RAID group including the blocked or recovered FMPKs 30 belongs, from, for example, the RAID management table 254 and the blockage management table 255 (S1801).

The RAID control program 251 specifies various RR thresholds matching the specified blockage/recovery RG environment from the configuration table 256, generates the specified various RR thresholds (the normal RR threshold, the reclamation RR threshold, the refresh RR threshold and the asynchronous RR threshold) and the time limit, and transmits the generated mode select command to each FMPK 30 of the RAID group including the blocked or recovered FMPKs 30 (S1802).

When normally finishing the command in each FMPK 30 (S1803: True), the RAID control program 251 finishes processing.

Meanwhile, when detecting an abnormality from one of the FMPKs 30 (S1803: False), if a retry count of the mode select command is less than a tolerance (S1804: True), the RAID control program 251 executes S1802 again. The processing to be executed again may include only transmitting a command in S1802. When the retry count of the mode select command reaches the tolerance (S1804: False), the RAID control program 251 performs predetermined failure processing (S1805).

Figure 18:
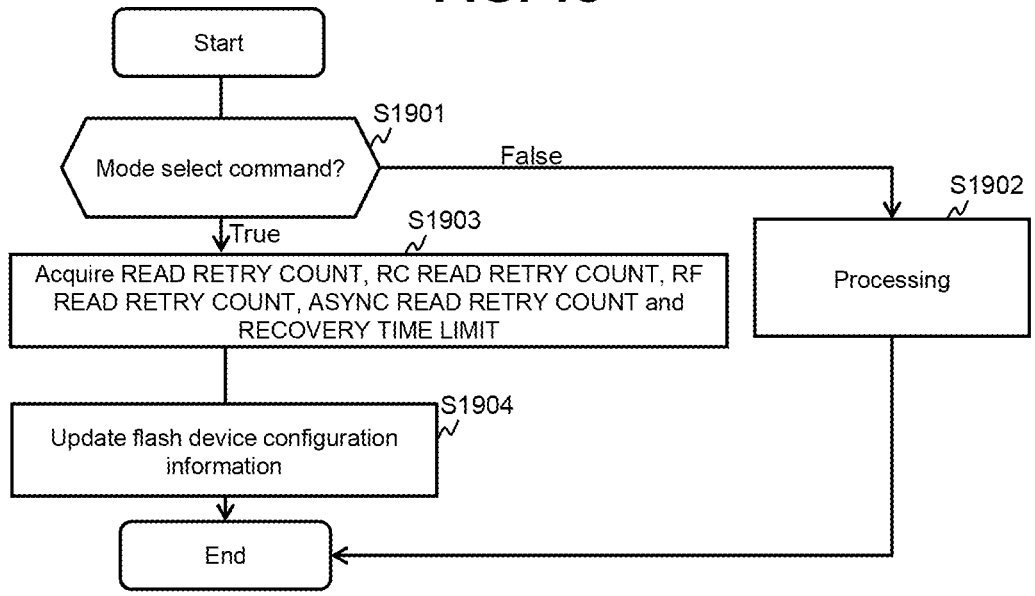
FIG. 18 shows processing performed by a FM control program 442 in the FMPK 30.

FIG. 18 shows processing performed by the FM control program 442 in the FMPK 30.

When the command is not the mode select command (S1901: False), the FM control program 442 executes processing according to this command (S1902). When, for example, the command is a read request from the storage controller 20, read processing of normal read is executed. Further, when, for example, a command is an internal command which is an internally issued command, processing is executed according to the internal command. The internal command may include, for example, a reclamation command, a refresh command and an inspection command.

When the command is the mode select command (S1901: True), the FM control program 442 acquires the various RR thresholds and the time limit from this mode select command (S1903), and configures the acquired various RR thresholds and time limit to the flash device configuration information 443 (S1904). The flash device configuration information 443 to which the various RR thresholds and the time limit are configured are as shown in, for example, FIG. 19.

As described above, RR thresholds are specified based on, for example, a RAID level and the number of blocked drives, the RAID level is specified from the RAID management table 254 and the number of blocked drives is specified from the blockage management table 255. As shown in, for example, FIG. 20, the RAID management table 254 shows a RAID group number, a RAID level and a number of each PDEV (FMPK) which forms the RAID group per RAID group. As shown in, for example, FIG. 21, the blockage management table 255 shows per RAID group the number of blocked PDEVs (the number of blocked FMPKs) and a state (such as normal or blocked) of each PDEV (FMPK) which forms a RAID group.

Meanwhile, even when RR thresholds are adjusted based on, for example, a RAID level and the number of blocked drives, the state of the FMPK 30 becomes a state which does not enable maintenance of response performance defined in the FMPK 30. The "state which does not enable maintenance of response performance" is a state corresponding to, for example, at least one of a case where a time passed after a read command is issued exceeds the above time limit and a case where a read retry count exceeds the default RR threshold. In case that default RR thresholds (default values) are configured to the FMPK 30 in advance and the default RR thresholds are not configured and changed by the storage controller 20 irrespectively of an increase and a decrease in the number of blocked FMPKs in the RAID group, it is assumed that the FMPK 30 is highly likely to enter a state which does not enable maintenance of response performance.

Then, in case of the state which does not enable maintenance of response performance defined in the FMPK 30, the FM controller 32 (e.g. the FM control program 442) returns a check response to a command (e.g. a read request) from the storage controller 20. The storage controller 20 which receives a check response controls whether or not to retransmit a read request to the FMPK 30. When the read request is retransmitted, new read processing is started in the FMPK 30. Hence, when at least one of a case where a time passed after a read command is issued exceeds the time limit and a case where the read retry count exceeds a RR threshold occurs in read processing according to a previous read command in the FMPK 30, at least one of these cases is canceled.

In case of a state which does not enable maintenance of response performance, the FMPK 30 can transmit a check response to the storage controller 20, and can leave to the storage controller 20 determination as to whether or not to continue processing. For example, the storage controller 20 may determine whether or not to retransmit the read request to the FMPK 30 according to whether or not the number of times of reception of the check responses is less than a predetermined value. Further, when, for example, receiving a check response, the storage controller 20 may recover data which needs to be read from the FMPK 30 using data in another FMPK 30 in the RAID group including this FMPK 30 instead of retransmitting the read request to the check response transmission source FMPK 30. Consequently, it can be expected that at least one of reduction of a read retry occurrence frequency in the FMPK 30 (reduction of an occurrence frequency of a read retry which causes response delay) and reduction of an uncorrectable error occurrence frequency in the FMPK 30 is realized.

In addition, as shown in, for example, FIG. 22, a check response may be a request sense response in which values of one or a plurality of predetermined items (e.g. "Sense key", "Additional sense code" and "Additional sense qualifier") are predetermined values. The storage controller 20 may receive the request sense response from the FMPK 30 by transmitting an auto sense to the FMPK 30 or may receive a request sense response from the FMPK 30 by transmitting a request sense command to the FMPK 30.

Further, when the number of times of reception of check responses from the same FMPK 30 reaches a predetermined count (e.g. the predetermined count is an integer equal to or more than 1) and when the storage controller 20 retransmits a read request, this read request may be a special read request instead of a normal read request. As shown in, for example, FIG. 23, the special read request is a read request including a parameter indicating a read mode select (READ MODE SELECT), i.e., a read mode selected from a plurality of read modes (a read option selection policy). A value of the read mode select may take, for example, four types of a first value (first read mode: a read option is selected based on read success count statistics), a second value (second read mode: a read option accompanied by performance delay is selected), a third value (third read mode: all read options are sequentially selected (e.g. for dynamic sparing)) and a fourth value (fourth read mode: a fourth default read option is selected).

Figures 24, 25, 26:
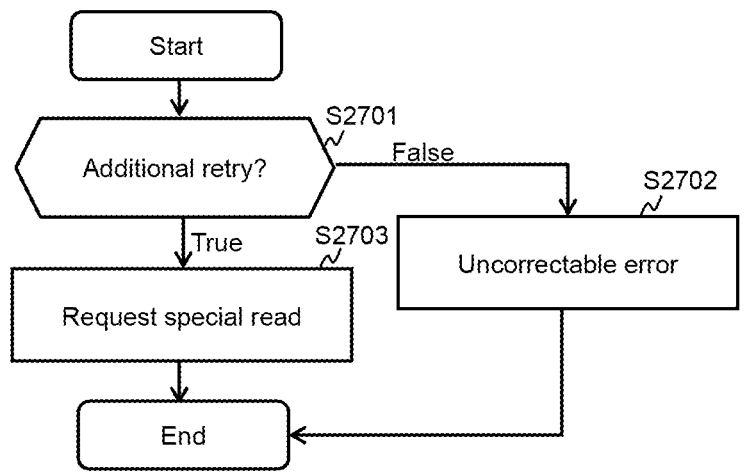
FIG. 24 is a schematic view where a read mode specified by a special read request is prioritized over a read mode configured by a mode select command.
FIG. 25 shows a first example of processing performed when the number of times of reception of check responses from the same FMPK 30 reaches a predetermined count.
FIG. 26 shows an example of information indicating whether or not to permit an additional retry per combination of a RAID level and the number of blocked FMPKs.

In addition, the read mode can also be configured according to the mode select command as described above. In this embodiment, as shown in FIG. 24, a read mode specified by a special read request is prioritized over the read mode configured by the mode select command. Even when, for example, the first read mode is configured by the mode select command to the FMPK 30 which transmits a check response, if the second read mode is specified in the special read request from the storage controller 20, the read mode of read processing (read processing of normal read) performed according to this special read request is the second read mode specified by this special read request. The special read request is a command issued to the FMPK 30 when the check response is received from the FMPK 30, and the check response is transmitted from the FMPK 30 in a state which does not enable maintenance of response performance as described above.

The storage controller 20 retransmits a normal read request when, for example, the number of times of reception of check responses from the same FMPK 30 is less than a predetermined count, and can perform processing shown in FIG. 25 when the number of times of reception of check responses from the same FMPK 30 reaches the predetermined count.

That is, the storage controller 20 determines whether or not to permit an additional retry (retransmission of a read request (S2701). The determination in S2701 may be performed based on a RAID configuration (e.g. a RAID level), the number of blocked FMPKs and whether or not there is redundancy in the RAID group including the check response transmission source FMPK 30. More specifically, the determination in S2701 is performed based on, for example, information shown in FIG. 26, i.e., information indicating a rule which defines whether or not (Yes or No) to permit an additional retry per combination of the RAID level and the number of blocked FMPKs. In addition, the information shown in FIG. 26 is stored in the memory 224 of the storage controller 20.

When a determination result in S2701 is false (S2701: False), the storage controller 20 executes predetermined uncorrectable error processing (S2702). Meanwhile, when the determination result in S2701 is true (S2701: True), the storage controller 20 generates a special read request with respect to the check response transmission source FMPK 30 by special read request generation processing, and transmits the generated special read request to this FMPK 30 (S2703).

Figure 27:
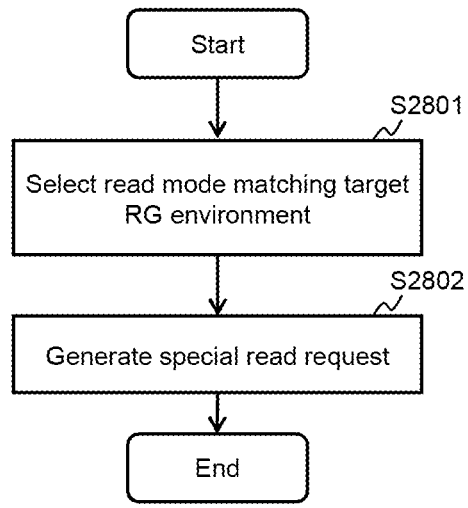
FIG. 27 shows a flow of special read request generation processing.

FIG. 27 shows a flow of special read request generation processing.

The storage controller 20 selects a read mode matching target RG environment upon generation of a special read request (S2801), and generates a special read request in which a value indicating the selected read mode is configured to a field of the read mode select (S2802). The "target RG environment" is environment in which a RAID group including the check response transmission source (or command transmission source) FMPK 30 belongs, and, more specifically, may be at least one of a RAID level, the number of blocked FMPKs, whether or not there is redundancy, whether or not performance is valued and a read/write frequency (the numbers of read requests and write requests received per unit time). In FIG. 27, the mode select command to which a longer time-out time is configured is also generated and, in S2703 in FIG. 26, this mode select command may also be transmitted in addition to the special read request. The read mode selected in S2801 may be the second read mode (the read option accompanied by performance delay is selected). This is because, as described above, the "read option accompanied by performance delay" is a read option which requires a time for read yet supports a read method which is highly likely to succeed in read by special processing inside a chip.

In addition, there may be the FMPK 30 which cannot process a special read request due to a specification or another reason. Alternatively, the storage controller 20 cannot generate a special read request due to a specification or another reason. In this case, the read mode may be specified by the mode select command instead of the special read request.

Figure 28:
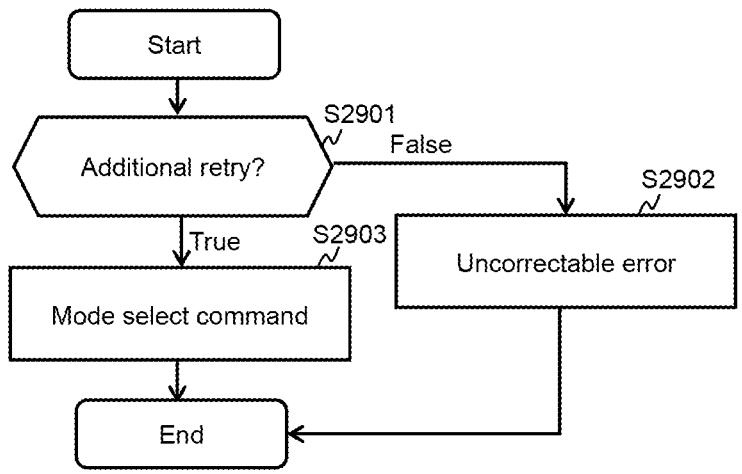
FIG. 28 shows a second example of processing performed when the number of times of reception of check responses from the same FMPK 30 reaches a predetermined count.

That is, the storage controller 20 retransmits a normal read request when, for example, the number of times of reception of check responses from the same FMPK 30 is less than a predetermined count, and performs processing shown in FIG. 28 when the number of times of reception of check responses from the same FMPK 30 reaches the predetermined count.

More specifically, the storage controller 20 determines whether or not to permit an additional retry (retransmission of a read request) (S2901). The determination in S2901 and the determination in S2701 may be performed in the same way as the determination in S2901.

When the determination result in S2901 is false (S2901: False), the storage controller 20 executes predetermined uncorrectable error processing (S2902). Meanwhile, when the determination result in S2901 is true (S2901: True), the storage controller 20 generates a mode select command with respect to the check response transmission source FMPK 30 by mode select command generation processing, and transmits the generated mode select command to this FMPK 30 (S2903). The read mode which is specified by the mode select command may also be a read mode matching target RG environment upon generation of the mode select command. For example, the mode select command generated when the number of times of reception check responses from the same FMPK 30 reaches a predetermined count may be the second read mode (the read option accompanied by performance delay is selected).

Figure 29:
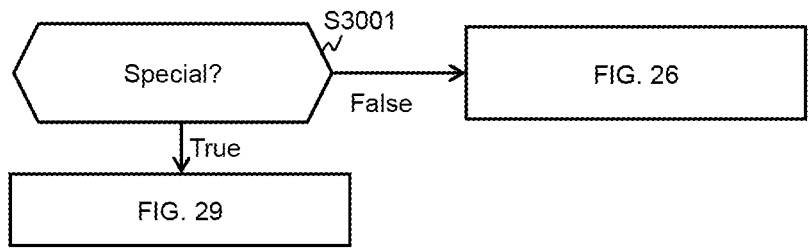
FIG. 29 shows an example of a branch as to which one of processing in FIGS. 25 and 28 is executed.

As to the storage controller 20 and the FMPK 30 which can generate process both of a mode select command and a special read request, the storage controller 20 may select which command is used to specify a read mode to the FMPK 30. It is possible to configure not only the read mode but also various RR thresholds and a time limit according to the mode select command. However, the FMPK 30 of this command transmission destination needs to enter a read/write suspended state (a state where a read request and a write request are not processed) for the mode select command. Meanwhile, the special read request cannot configure at least one of various RR thresholds and a time limit. However, the command transmission destination FMPK 30 does not need to enter the read/write suspended state. Hence, when specifying a read mode to the check response transmission source FMPK 30, as shown in FIG. 29, the storage controller 20 determines whether to generate a special read request or to generate a mode select command according to target RG environment upon reception of a check response (S3001), and perform the processing shown in FIG. 25 when determining to generate the special read request (S3001: True) and perform the processing shown in FIG. 28 when determining to generate the mode select command (S3001: False). When, for example, a read/write frequency of a target RG (a RAID group including the check response transmission source FMPK 30) is less than a predetermined value in the target RG environment upon reception of a check response, generation of the mode select command may be selected and, when the read/write frequency of the target RG is a predetermined value or more, generation of the special read request may be selected.

Figure 30:
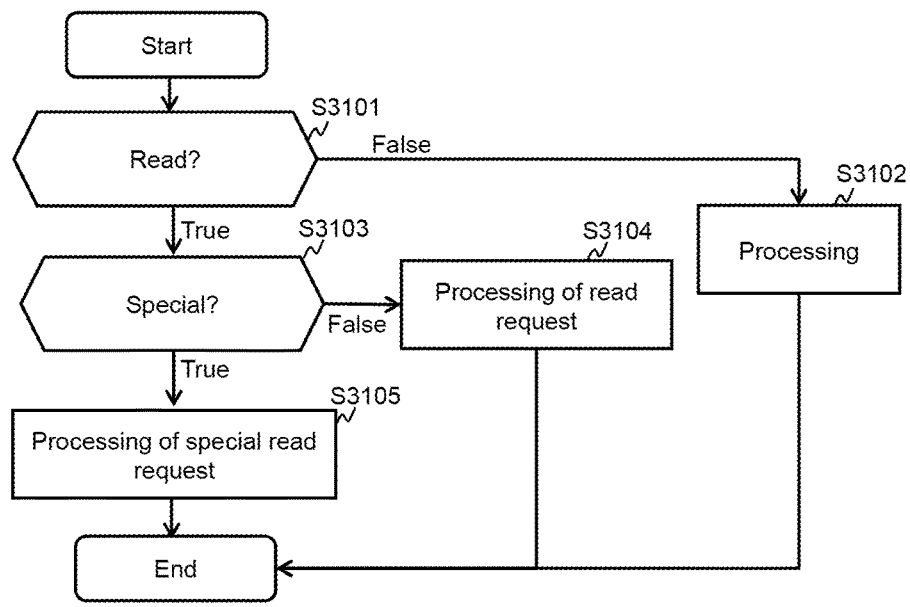
FIG. 30 shows a flow of processing performed by a FM controller 32 of the FMPK 30 which receives a command.

FIG. 30 shows a flow of processing performed by the FM controller 32 of the FMPK 30 which receives a command.

When the received command is a command other than a read request (S3101: False), the FM controller 32 executes processing according to this command (S3102). When the command is the mode select command, processing is executed according to the mode select command in S3102.

When the received command is a read request and this read request is a normal read request (S3101: True and S3103: False), the FM controller 32 executes read processing (e.g. read processing of normal read) according to this read request in the configured read mode (e.g. the read mode configured by a past mode select command) (S3104).

Meanwhile, when the received command is a read request and this read request is a special read request (S3101: True and S3103: True), the FM controller 32 executes read processing according to this special read request in the read mode specified by this special read request (S3105).

As described above, the FM controller 32 executes read using a configuration option in option management units (a die in this embodiment) to which a read source page belongs. When a plausible read option selected for read is different from the configuration option of the die including the read source page, read needs to be executed after the configuration option is changed to the selected read option (see S909 in FIG. 9). Read environment differs even upon read in the same option management units. Consequently, a configuration option is likely to be frequently changed for a plurality of reads in the same option management units.

Figure 31:
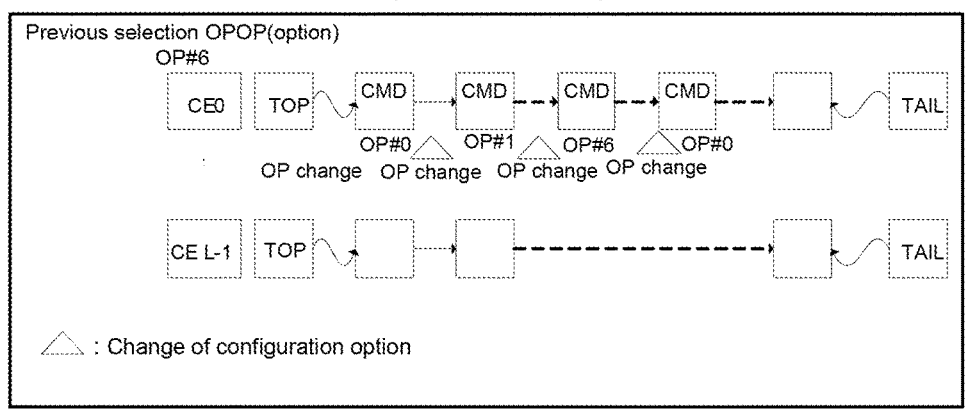
FIG. 31 shows a comparative example of execution of a read command.

When, for example, a read command queue (a read command queue with respect to a read source page in a FM chip belonging to a CE line) is managed per CE line as in a comparative example shown in FIG. 31, a plurality of different read commands of the selected read option is arranged in the read command queue of the same CE line (e.g. CE line 0). In this case, when the read commands are executed in arrangement order, the configuration option is frequently changed (S909 in FIG. 9). More specifically, for example, changing a configuration option requires issuing from the FM controller 32 a command (e.g. SetFeature) which changes one to a plurality of (e.g. four) options to a FM (die), and read from this FM (die) cannot be executed while the command is issued. Further, when a read option is returned to an option number (e.g. 0) which indicates normal read every time read is performed, the number of commands becomes the number of commands (e.g. four times at maximum) for returning for one read the number of commands (e.g. four times at maximum) required to change an option+read (once)+an option to a default state under a situation where the option is frequently changed. The frequent change in the option causes performance delay. Therefore, it is desirable to reduce changes (e.g. four times at maximum) and returns (e.g. four times at maximum) as much as possible. Hence, as in this embodiment, it is effective to change a read option when necessary without returning the read option to the default state. Further, under a situation where a read option is frequently changed (e.g. a situation where power is not activated for a long period of time after power interruption and then power is activated on again), retry read frequently occurs and read options are also changed in all dies. Furthermore, in the FMPK having a small number of buses, a small number of CE lines and a small number of dies, an influence caused when retry read occurs once becomes significant. Still further, when a result obtained by SetFeature is checked by GetFeature to more adequately change a read option, the number of commands further increases. Frequent changes in a configuration option cause performance delay of the FMPK 30.

Hence, in this embodiment, the FM controller 32 optimizes an execution order of read commands (read) and, more specifically, continuously executes a plurality of read commands of the same read option per read option. Consequently, it is possible to reduce an occurrence frequency of a configuration option change.

Figures 32, 33:
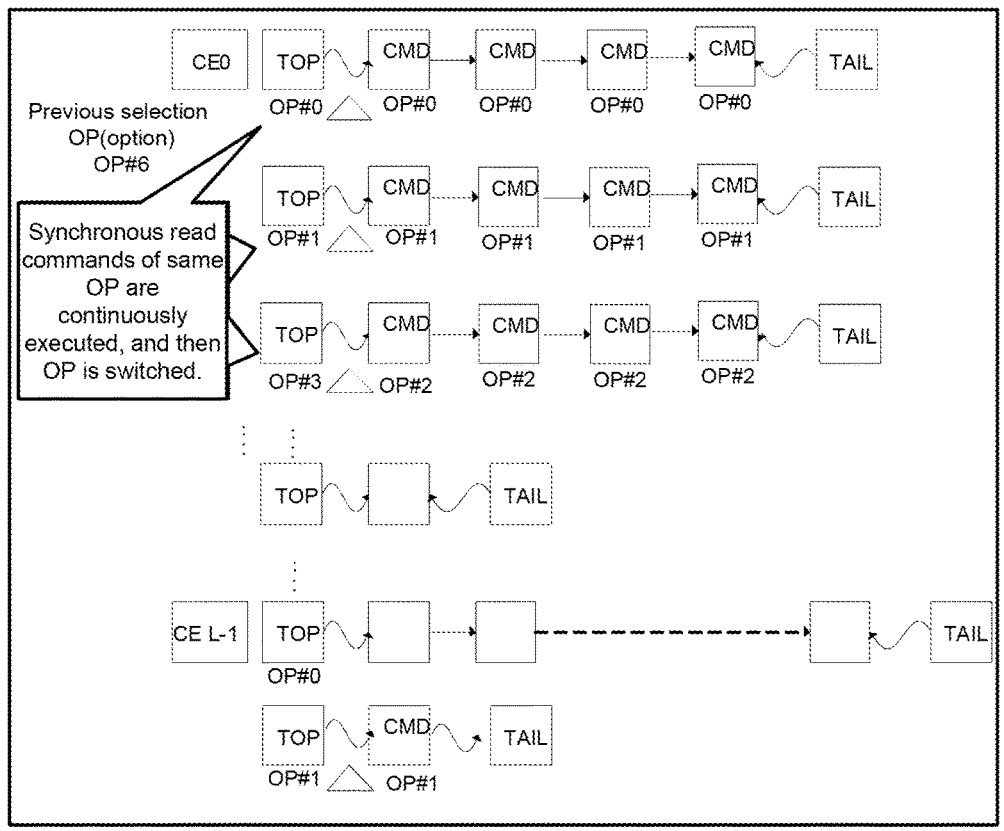
FIG. 32 is an explanation chart of execution of a read command according to Embodiment 1.
FIG. 33 shows a configuration of a read command.

More specifically, as shown in FIG. 32, a read command queue is provided for each CE line per read option. In this embodiment, a read option is configured in first units (e.g. per die), and a read command queue is provided in second units (e.g. per CE line) larger than the first units. Read commands are arranged in a read command queue in, for example, issuance order of the read commands. The FM controller 32 couples the generated read commands to a read command queue matching the read option selected for this read command and the CE line coupled to the FM chips 403 including the resource source page specified by this read command every time a read command is generated. The FM controller 32 selects for each CE line a read option according to a predetermined rule, and continuously executes a plurality of read commands in the read command queue of the selected read option. According to the predetermined rule, the read option which is selected first may be the same read option as a configuration option (e.g. a read option #6) or the last changed configuration may be the most plausible read option for the CE line. Further, the number of read commands continuously executed from one read command queue (in other words, a time length required to continuously execute read commands from read commands) may be the same between all read options or may be different between read options. Furthermore, the predetermined rule may be based on at least one of a response time required to make a response after a read command is received, the number of read commands coupled to one read command queue and an execution unit value (the amount of work) matching the read option.

In addition, a read command queue per read option is provided per predetermined queue unit. However, the predetermined queue unit may be at least one of a FM bus, a die and a FM chip instead of or in addition of a CE line. Further, the FM controller 32 may further have a hardware execution queue (e.g. a queue on the high-speed memory 44) in queue units (e.g. per CE line). The FM controller 32 (e.g. the CPU 42) accumulates read commands corresponding to the number of continuous execution commands in the hardware execution queue from each read command queue (a read command queue of the same read option) in queue units, and the FM controller 32 (e.g. the FM I/F 46) may execute read commands in arrangement order in the hardware execution queue.

FIG. 33 shows a configuration of a read command.

The read command includes, for example, a "type", read source information, a "read option number" and a "next pointer". The read source information is information for identifying a resource source page, and includes, for example, a "bus number", a "CE number", a "die number", a "block number" and a "page number". The "type" represents a read type (e.g. normal read or reclamation read). The "bus number" represents a number of a FM bus to a FM chip including a read source page. The "CE number" represents a number of a CE line to a FM chip including the read source page. The "die number" represents a number of a die including the read source page. The "block number" represents a number of a block including the read source page. The "page number" represents a number of the read source page. The "read option number" represents a number of the selected read option. The "next pointer" represents a coupling destination of this read command.

FIG. 34 shows a configuration of an enqueue destination determination table.

An enqueue destination determination table 3500 represents enqueue destination rules of read commands and the numbers of read commands (the numbers of execution queue read commands) coupled to read command queues. This table 3500 may be stored in, for example, the high-speed memory 44. The enqueue destination rule is a combination of a bus number, a CE line number, a read option number and an enqueue destination queue. A queue matching a bus number, a CE line number and a read option number in a read command is specified from this table 3500, and the read command is coupled to the specified queue. In addition, an enqueue destination may be determined by another method such as condition determination instead of determining an enqueue destination using the table 3500.

A read command queue is classified per read option and, consequently, it is possible to execute a read command to minimize a configuration option change count. Read command queues prepared per CE line and per read option may be a synchronous command queue and an asynchronous command queue. The read command (synchronous RD command) issued according to a read request from the upper apparatus is coupled to the synchronous command queue. The synchronous RD command is a read command of normal read in this embodiment. The read command (asynchronous RD command) issued irrespectively (out of synchronization with) a read request from the upper apparatus is coupled to an asynchronous command queue. The asynchronous RD command is a read command of reclamation read, refresh read and asynchronous read in this embodiment. For example, an execution order of synchronous RD commands needs to be optimized to respond to data according to a read request within a certain time (response time limit) after a read request is received from the upper apparatus. The number of read commands continuously executed from a read command queue (e.g. a synchronous command queue) is a number determined based on, for example, characteristics of a read option matching this read command queue and may be, for example, a number determined according to one of the following first and second point of views.

According to the first point of view, a maximum number of continuous execution commands (the maximum number of read commands to be continuously executed) is defined for read command queues according to a total number of execution queue read commands (the total number of execution queue read commands coupled to all read command queues or the total number of execution queue read commands coupled to all read command queues) per read option. More specifically, for example, a first execution limitation table 3600 shown in FIG. 35 is prepared. In the first execution limitation table 3600, the total numbers of execution queue read commands and the maximum numbers of continuous execution commands per read option (this number is preferably a number which does not make a read option switch earlier and make a response time longer) are defined. The defined maximum number of continuous execution commands is determined based on read option characteristics, and takes a value which enables a response to a read request within a response time limit (an upper limit of the time required to make a response after the read request is received). The table 3600 may be stored in, for example, the high-speed memory 44. The FM controller 32 specifies the maximum number of continuous execution commands of a read command queue of a certain read option based on the table 3600 and the number of execution queue read commands. When continuously executing read commands corresponding to the specified maximum number of continuous execution commands from the read command queue of the certain read option (alternatively, when there is no command which is previously coupled to this queue), the FM controller 32 switches the read option to another read option and executes read commands from the read command queue of the switched read option. According to the first point of view, it is possible to reduce a configuration option change occurrence count while guaranteeing a response to a read request within a response time limit.

According to the second point of view, the maximum number of continuous execution commands is determined for a read command queue per read option according to the total number of execution queue read commands, a read response performance unit value per read option (a response time of a read command or a value determined based on this time) and the number of command queues to which at least one read command is coupled. More specifically, according to the second point of view, the above read option characteristics take a read response performance unit value of a read option, and, for example, a unit value table 3700 shown in FIG. 36 and a second execution limitation table 3800 shown in FIG. 37 are prepared. The unit value table 3700 represents a read response performance unit value per read option. In the second execution limitation table 3800, the total number of execution queue read commands and maximum response performance per read option are recorded. The maximum response performance takes a value determined based on the unit value table 3700, the total number of execution queue read commands and the number of read command queues to which at least one read command is coupled. Hence, when the number of read command queues to which at least one read command is coupled increases or decreases, the corresponding value of the maximum response performance is changed by the FM controller 32.

In addition, as to an individual read command, the maximum response performance may be a tolerance detention time after read commands are accumulated in a read command queue. The FMPK 30 may have a default value of the maximum response performance. As long as the maximum response performance is not changed according to a predetermined command (e.g. a mode select command) from the storage controller 20, the stored maximum response performance is used.

The maximum response performance can be dynamically changed, and can be dynamically changed according to a predetermined command (e.g. mode select command) from the storage controller 20. More specifically, for example, the FM controller 32 changes the configured maximum response performance to maximum response performance in a predetermined command after finishing processing a read command which is being executed, and applies the changed maximum response performance to a read command which remains in the read command queue (or a hardware execution queue). Alternatively, for example, the FM controller 32 may store a time at which this predetermined command is received, and may apply the changed maximum response performance to the read command which starts being executed after this time.

The tables 3700 and 3800 may be stored in, for example, the high-speed memory 44. As shown in FIGS. 36 and 37, when, for example, the total number of execution queue read commands is "1024" and the read option number is "2", the maximum response performance is "636" and the read response performance unit value is "53" and the maximum number of continuous execution commands is "12" (=636/ 53). In addition, in the unit value table 3700, the read response performance unit value per read option is "1", and the maximum response performance recorded in the second execution limitation table 3800 may be the maximum number of continuous execution commands. Further, the enqueue (e.g. an enqueue to a hardware execution queue) may also be controlled based on a read response performance unit value per read option in addition to execution of read commands from a queue. When the enqueue is controlled, read commands are stored in, for example, the high-speed memory 44 in a state where the read commands are not coupled to the queue, and may be enqueued based on a cumulative counter table 3900 shown in FIG. 38. In the table 3900, a cumulative value of read response performance unit values of read commands is recorded by the FM controller 32 per FM bus and per CE line (i.e., per FM chip).

Figure 39:
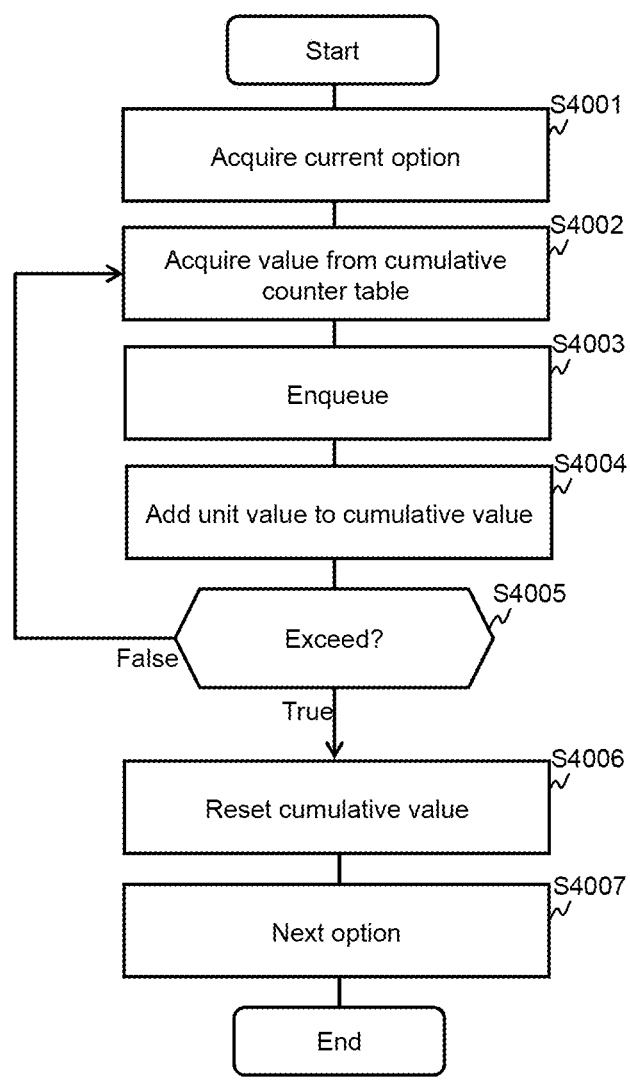
FIG. 39 shows an example of enqueue control processing of a synchronous RD command.

FIG. 39 shows an example of enqueue control processing of a read command. FIG. 39 shows processing which causes the CPU 42 to enqueue a read command to a hardware execution queue managed by the FM I/F 46 from a read command queue. That is, the CPU 42 optimally allocates read commands to a hardware execution queue per CE line referring to the tables in FIGS. 36 and 38 from the read command queue (see FIG. 32) to meet the time limit (maximum response performance).

The CPU 42 acquires a current option (current target option) (S4001).

The CPU 42 specifies a top read command (referred to as a target command below) of the read commands in the read command queue matching the current option, and specifies from the cumulative counter table 3900 a cumulative value matching a bus number and a CE number specified by the target command (S4002). The CPU 42 enqueues the target command to the hardware execution queue matching the CE number specified by the target command (S4003). The CPU 42 adds a read response performance unit value matching the current option, to the cumulative value specified in S4002 (S4004).

When the cumulative value after addition is maximum response performance or less matching the total number of execution queue read commands and the current option (S4005: False), the CPU 42 performs S4002 again.

Meanwhile, when the cumulative value after addition exceeds the maximum response performance matching the total number of execution queue read commands and the current option (S4005), the CPU 42 resets the cumulative value after addition in the table 3900 (e.g. resets the cumulative value to 0) (S4006), and uses the next read option as the current option (S4007).

In addition, the number of read commands to be continuously executed from one read command queue based on the table 3700 shown in FIG. 36 and the table 3800 shown in FIG. 37 may be controlled based on a response time counter table (not shown) employing the same configuration as that of the table 3900 shown in FIG. 38. In the response time counter table, a cumulative value of response times of read commands may be recorded by the FM controller 32 per FM bus and per CE line (i.e. per FM chip). The FM controller 32 may control the number of continuous execution commands based on a cumulative value of response times. When, for example, a difference between maximum response performance and a response time cumulative value of a certain read option is less than a read response performance unit value, the FM controller 32 may stop execution of commands using this read option from a read command queue and switch this read option to another read option. Consequently, it is possible to reduce a configuration option change count while guaranteeing a response time limit even when there is a difference between a read response performance unit value and an actual response time. Further, both of the read command queue shown in FIG. 32 and the above hardware execution queue may be provided under the FM controller 32 (the FM I/F 46 in particular, and may be controlled by hardware implementation.

Embodiment 2

The Embodiment 2 will be described below. In this regard, differences from Embodiment 1 will be mainly described, and points common to Embodiment 1 will not be described or simplified.

Figure 40:
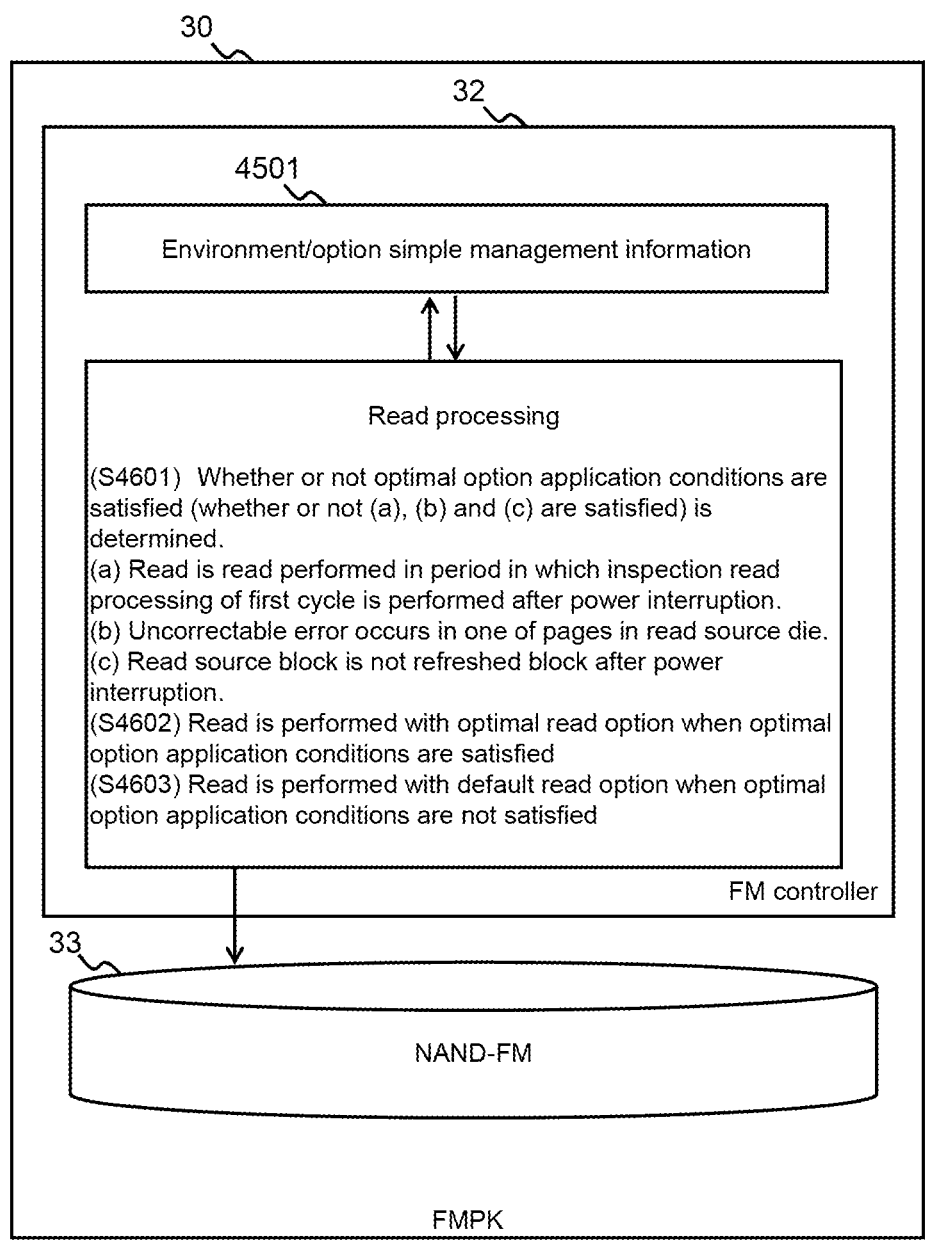
FIG. 40 schematically shows Embodiment 2.

FIG. 40 schematically shows Embodiment 2.

A size of read success count management information 452 described in Embodiment 1 is assumed to be large. This size further becomes larger when at least one of numerical values of a PE count range and an elapsed time range increases.

Hence, in Embodiment 2, instead of the read success count management information 452, a FM controller 32 holds environment/option simple management information 4501 which is simple information of the read success count management information 452. A size of the environment/ option simple management information 4501 is smaller than a size of the read success count management information 452. The environment/option simple management information 4501 is stored in a high-speed memory 44 or a low-speed memory 45. The environment/option simple management information 4501 does not include a record per PE count range and per elapsed time range, and does not include a read success count, either. FIG. 41 shows a configuration of the environment/option simple management information 4501. In the environment/option simple management information 4501, a read option upon success of read is recorded per die (more accurately, per a combination of a FM bus, a CE line and a die). More specifically, when read from a read source page succeeds, a read option upon success of read is recorded in the environment/option simple management information 4501 for a die including this read source page. In the following explanation of Embodiment 2, a read option recorded in the environment/option simple management information 4501 is referred to as an "optimal read option". In addition, an optimal read option is recorded per die, i.e., in units larger than read units (page units). Hence, even when a first read option which is used for successful read from a first page is recorded, if a read option which is used for successful read from another second page is the second read option for the same die, the second read option is recorded instead of the first read option for the same die. Further, when a read source is the first page again for the same die, the read option upon previous success of read is the first read option. However, the recorded read option is the second read option, and therefore the second read option is used.

In read processing according to Embodiment 2, optimal option application determination as to whether or not to apply an optimal read option instead of a default read option is performed (S4601). When the determination result in S4601 is true, the FM controller 32 performs read using an optimal read option matching a read source die (a die including a read source page) (S4602). Meanwhile, when the determination result in S4601 is false, the FM controller 32 performs read from the read source page using the default read option. When read in S4602 or S4603 fails, a read option to be used is switched to another read option, and read is performed using the switched read option. The read option is switched according to, for example, a read option switch rule shown in FIG. 42. According to this rule, when, for example, a read option 4 is used for the first read, a read option to be used next due to failure of read is a read option 0.

The optimal option application determination may be performed by each read processing after power of the FMPK 30 is activated for the first time. In this embodiment, each read processing is performed after power interruption of the FMPK 30 (power is activated again). This is because data holding characteristics of a physical block generally deteriorate when a flash memory is left after power interruption.

A determination result of optimal option application determination is true when optimal option application conditions are satisfied. That the optimal option application conditions are satisfied are that all following sub conditions (a) to (c) are satisfied. (a) Read is read in a period in which inspection read processing of the first cycle after power interruption is performed. (b) An uncorrectable error occurs in one of pages of a read source die. (c) A read source block (a physical block including a read source page) is not a refreshed block after power interruption.

Each of the sub conditions (a) to (c) will be described below.

<Sub Condition (a): Read is Read in a Period in which Inspection Read Processing of the First Cycle after Power Interruption is Performed.>

The FM controller 32 performs inspection read processing per fixed cycle (e.g. one day) for the purpose of preventing occurrence of an uncorrectable error of the NAND-FM 33 in advance. In the inspection read processing, data is read from an inspection target page (at least one physical page) in each of all physical blocks in the FMPK 30, and the number of error bits of the read data is checked. That is, "inspection read" is read from one inspection target page, and "inspection read processing" is processing including each inspection read of all inspection target pages. That "one cycle of inspection read processing is finished" means that inspection read from each of all inspection target pages is finished. Hence, "inspection read processing of the first cycle after power interruption" means a period in which, after power is activated after power interruption, inspection read from all inspection target pages (e.g. all inspection target pages in all physical blocks) is finished. An "inspection target page" may be a physical page selected at random for each physical block, and may be a predetermined type of a page (e.g. MSB page) in each physical block. Success of inspection read means that all error bits of data read using a predetermined read option can be corrected (can be corrected by, for example, an ECC (Error Correcting Code)). Failure of inspection read means that data cannot be read using a predetermined read option (i.e., data read using a predetermined read option includes multiple error bits to such a degree that all error bits cannot be corrected).

A "predetermined read option" used upon each inspection read is, for example, the same read option (e.g. read option 0) as the default read option. That is, the FM controller 32 performs retry read from the same inspection target page, i.e., read using another read option when inspection read fails. The FM controller 32 can manage each physical block in inspection read processing as follows. That is, when there is even one error uncorrectable page (an inspection target page whose read using any read option fails), the FM controller 32 performs refresh processing on a physical block including the error uncorrectable page and manages this physical block as an operating life block (a physical block which cannot be reused). Further, even when there is not an error uncorrectable page yet there is one retry success page (a page whose retry read succeeds after inspection read fails), the FM controller 32 performs refresh processing on a physical block including a retry success page and manages this physical block as an empty physical block (a physical block which cannot be reused). Furthermore, even when inspection read succeeds, if the number of error bits of data read by this inspection read exceeds a threshold, the FM controller 32 performs refresh processing on a physical block including a read source page of this inspection read. When, for example, the number of error bits of data whose inspection read succeeds exceeds a threshold A (e.g. a short operating-life threshold), the FM controller 32 performs refresh processing on a physical block including a read source page of this inspection read, and manages this physical block as a short operating-life block (a physical block which cannot be reused). Further, when the number of error bits of data whose inspection read succeeds is less than the threshold A yet exceeds a threshold B (e.g. a refresh threshold), the FM controller 32 performs refresh processing on a physical block including a read source page of this inspection read, and manages this physical block as an empty physical block (a physical block which can be reused). That is, in this example, a physical block on which refresh processing is not performed in inspection read processing is a physical block whose inspection read from any inspection target page succeeds and whose number of error bits of read data is a predetermined threshold or less. In addition, this is an example of physical block management, and physical block management in inspection read processing may also adopt other modes. The "refresh processing" is processing of reading data (valid data in particular) from a physical block, correcting an error, and migrating error-corrected data to another physical block (e.g. a physical block whose PE count is lower than that of a migration source physical block). In the refresh processing, instead of a migration source physical block, a migration destination physical block is allocated to a logical area (e.g. logical block) to which a migration source physical block is allocated. A term of a "refreshed block" in the following explanation means a migration destination physical block in which data migrated by the refresh processing is stored. In addition, when a NAND-FM 33 is a recordable type, i.e., a logical area to which a physical page is allocated is a write destination, an empty physical page is allocated to a write destination logical area (e.g. a logical page) instead of an allocated physical page, and data is written in a newly allocated physical page. As to each logical area, data which is written in a newly allocated physical page is "valid data". A physical page in which valid data is written is a "valid page". Data which is stored in a physical page allocated in the past is "invalid data". A physical page in which invalid data is written is an "invalid page".

That one cycle of the above inspection read processing is finished is as follows. That is, data stored in a physical block whose read using read option 0 fails is migrated to another physical block by refresh processing, so that data can be successfully read. Until one cycle of the inspection read processing is finished, success of read from all physical blocks is not necessarily guaranteed. When the inspection read processing is finished, retry read such as normal read (synchronous read) to be subsequently performed does not need to be fully used.

From this point of view, the sub condition (a) is adopted.

<Sub Condition (b): An Uncorrectable Error Occurs in One of Pages of a Read Source Die.>

An error occurrence tendency differs per die, i.e., per read option configuration unit. For example, a physical block in the same die tends to deteriorate at the same speed. More specifically, for example, a die is a wafer portion sampled (cut) from a silicon wafer. Quality differs depending on portions of a silicon wafer. A plurality of dies is packaged by a method such as BGA (Ball Grid Array). However, dies are physically separated and are physically different as described above. The FMPK 30 includes a plurality of dies. However, a plurality of these dies is cut from different portions of a wafer, and therefore characteristics (e.g. an error occurrence tendency) are assumed to vary.

From this point of view, the sub condition (b) is adopted. That is, even when an uncorrectable error does not occur in a read source page itself, if an uncorrectable error occurs in one of pages in a die including the read source page, the FM controller 32 performs read by changing an option, i.e., performs read using an optimal read option matching a die including the read source page instead of the default read option. Consequently, it is possible to reduce read which is likely to fail even if a read option is not changed. As a result, performance improves.

<Sub Condition (c): A Read Source Block is not a Refreshed Block after Power Interruption.>

The refreshed block after power interruption is not a physical block left after power interruption and therefore does not need to be read using an optimal read option.

From this point of view, the sub condition (c) is adopted. In addition, refresh processing may be performed for normal read (synchronous read) (read which occurs following a request from an upper apparatus) and reclamation read in addition to a case where inspection read fails.

The optimal option application conditions have been described above.

Figure 43:
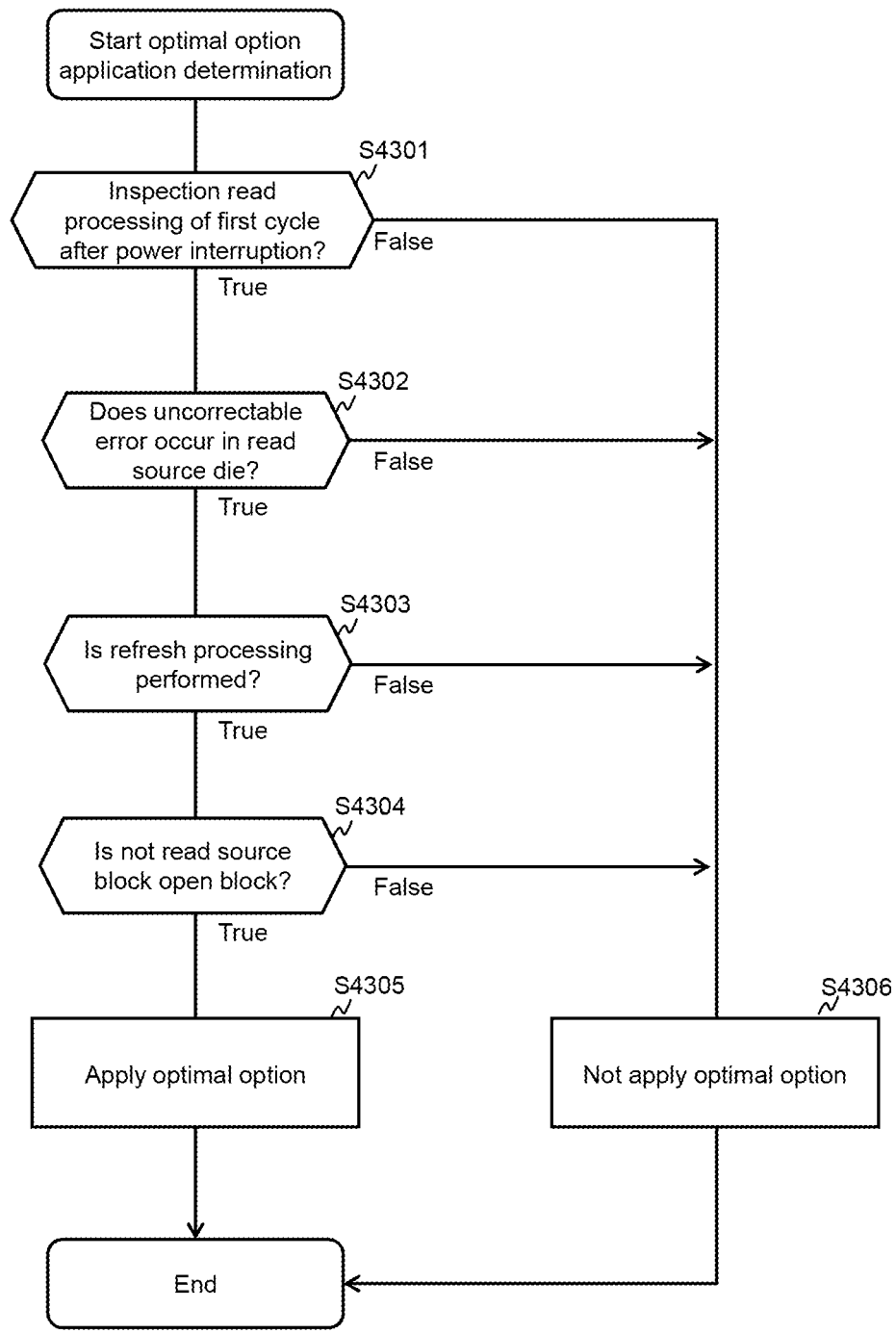
FIG. 43 shows a flow of optimal option application determination processing according to Embodiment 2.

FIG. 43 shows a flow of the optimal option application determination processing.

The FM controller 32 determines whether or not the sub condition (a) is satisfied, i.e., whether or not a read source block (a physical block including a read source page) is a physical block inspected in the inspection read processing of the first cycle (S4301).

When a determination result in S4301 is true (S4301: True), the FM controller 32 determines whether or not the sub condition (b) is satisfied, i.e., whether or not an uncorrectable error occurs in one of pages of the read source die (a die including the read source page) (S4302). In addition, when an uncorrectable error occurs in one of pages of a read source die upon at least one of normal read (synchronous read), reclamation read and refresh read, the determination result in S4302 is true.

When the determination result in S4302 is true (S4302: True), the FM controller 32 determines whether or not the sub condition (c) is satisfied, i.e., whether or not the read source block is a refreshed block after power interruption (S4303).

When the determination result in S4303 is true (when the read source block is not the refreshed block after power interruption), the FM controller 32 determines whether or not the sub condition (d) is further satisfied, i.e., a read source block is an open block (S4304).

When the determination result in S4304 is true (when the read source block is not an open block), i.e., when all sub conditions (a) to (d) are satisfied, the FM controller 32 determines to apply an optimal option (S4305).

Meanwhile, when at least one of determination results in S4301 to S4304 is false, i.e., when at least one of the sub conditions (a) to (d) is not satisfied, the FM controller 32 determines not to apply an optimal option (S4306).

Optimal option application determination processing is a logic to determine to which one of a case A and a case B read corresponds according to one point of view.

The "case A" is a case where applying an optimal option needs to be avoided and is, for example, a case corresponding to at least one of a case where a PE count (data erasure count) is relatively low and a case that an elapsed time (a time passed after data is written in a top page of a block) is relatively short. Meanwhile, the "case B" is a case where an optimal option needs to be applied and is, for example, a case corresponding to at least one of a case where at least the PE count is relatively high and a case where the elapsed time is relatively long.

The reason to determine to which one of the case A and the case B read corresponds is as follows. That is, the case A corresponds to at least one of a case where an error occurrence tendency is not clear and a case where read is highly likely to be performed without applying an optimal read option (read can be performed using the read option 0 used even upon inspection read). Consequently, avoiding applying an optimal read option is desirable. Meanwhile, the case B corresponds to at least one of a case where at least the error occurrence tendency is clear and a case where a read retry is highly likely to occur when a default read option is used. Consequently, applying an optimal read option is desirable.

Until, for example, one cycle of inspection read processing is finished after power interruption, if an uncorrectable error does not occur in a read source die, the PE count is assumed to be relatively low. An optimal read option is used when an elapsed time is relatively long after power interruption, and therefore the default read option (a read option which needs to be selected first) is fixed to a predetermined read option such as the read option 0. The read option is fixed to the read option 0. Consequently, instead of using the read success count management information 452 as in Embodiment 1, adopting simple information shown in FIG. 41 and determining a read option of use by a logic as in Embodiment 2 are assumed to be more efficient. A refreshed block after power interruption corresponds to at least one of a relatively low PE count and a relatively short elapsed time. Therefore, the default read option 0 is used instead of the optimal read option (a read option used upon previous successful read). In addition, the refreshed block after power interruption has a short elapsed time compared to a physical block on which refresh processing is not performed after power interruption. The FM controller 32 may associate information (referred to as a power interruption flag below) which means a physical block having undergone power interruption, with each physical block before power interruption, and may remove a power interruption flag associated with this physical block when the physical block becomes the refreshed block after power interruption. It is possible to determine whether or not each physical block is a refreshed block after power interruption based on whether or not there is a power interruption flag. Alternatively, the FM controller 32 can manage an erasure time per physical block after power interruption, and determine whether a physical block undergoes power interruption, based on the erasure time of each physical block to determine whether or not a physical block undergoes power interruption for a long period of time. Further, a physical block in a die in which an uncorrectable error occurs until one cycle of inspection read processing is finished after power interruption is determined as a physical block candidate corresponding to at least one of a relatively high PE count and a relatively long elapsed time.

According to the above configuration, it is possible to determine whether or not it is desirable to apply an optimal read option without using a read success count (success counter) as in Embodiment 1. When, for example, read corresponds to the case B, a state upon read is a state where an error occurrence tendency (a tendency of how characteristics deteriorate) is clearly learned to some degree. In this state, read using the optimal read option (previously successful read option) is highly likely to succeed. Consequently, optimal option application determination processing and the environment/option simple management information 4501 can increase a likelihood that the first read succeeds without a read success count (success counter).

In addition, the further sub condition (d) is provided in the determination processing in FIG. 43. However, the sub condition (d) is as follows.

An "open block" is a physical block in which data is written in halfway physical pages (a physical block in which an empty page in which data is written in at least a top page still remains). For example, one physical block is configured by N physical pages (N is an integer equal to or more than 2), and data is written up to X pages (X is an integer equal to or more than 2 and is smaller than N). In this case, characteristics tend to deteriorate (an error occurrence rate becomes high) in a page (X–Y) to a page X (Y pages back from a page in which data is written last) (Y is an integer equal to or more than 1). When data is written in all pages, characteristics do not deteriorate in this way. Further, deterioration of characteristics due to an open block does not depend on characteristics of all dies. Hence, read does not necessarily succeed using a read option which is used for successful read from another block in a die. Further, even when data can be read from an open block using an optimal read option, the optimal read option is not necessarily applicable to another block in the die. From this point of view, when the read source block is an open block, the FM controller 32 determines not to apply an optimal option.

Figure 44:
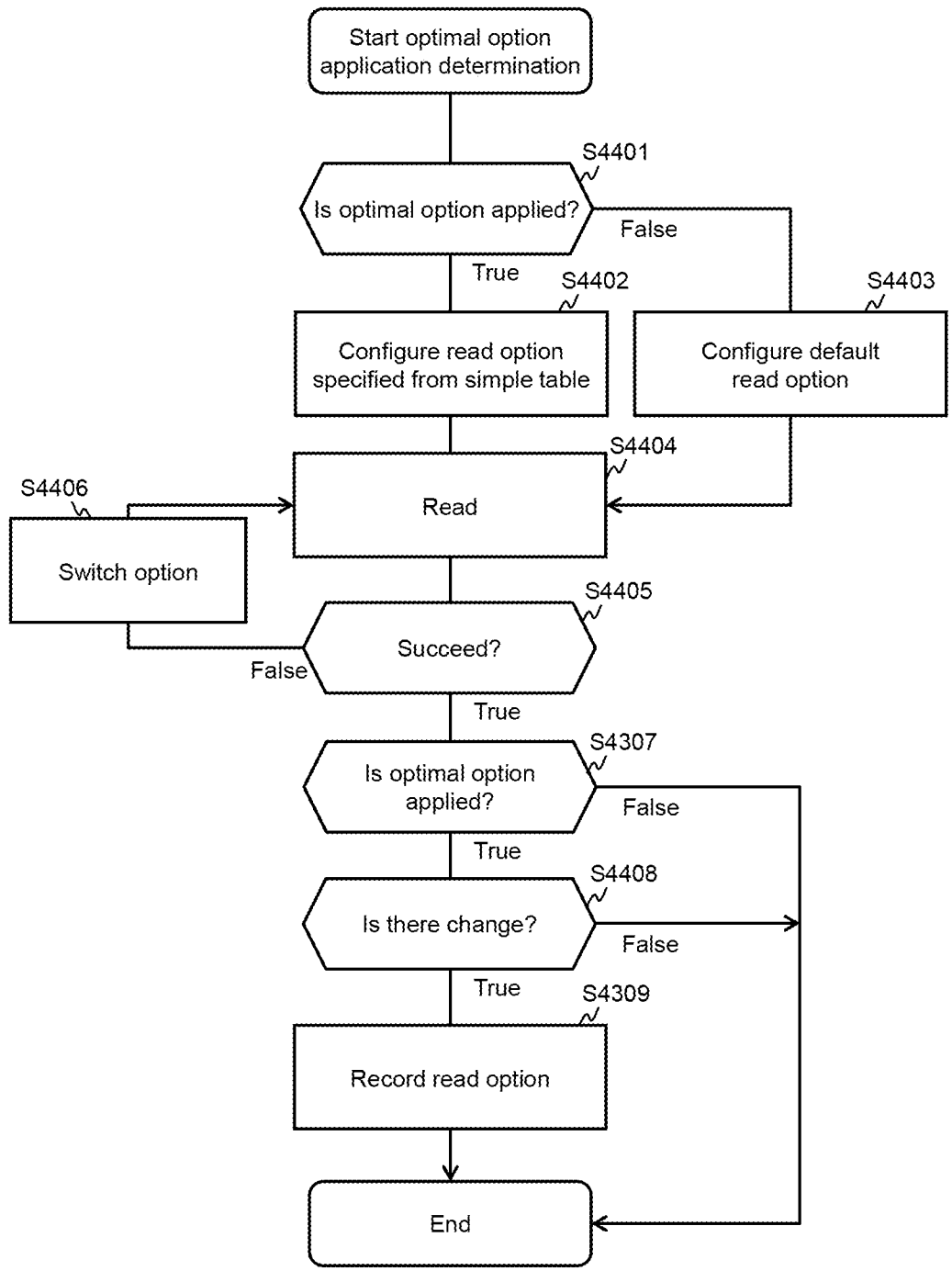
FIG. 44 shows a flow of read processing according to Embodiment 2.

FIG. 44 shows a flow of read processing according to Embodiment 2.

The FM controller 32 performs optimal option application determination processing shown in FIG. 43 (S4401).

As a result in S4401, when it is determined to apply an optimal option (S4401: True), the FM controller 32 specifies the optimal read option matching the read source die from the environment/option simple management information 4501, and configures the specified optimal read option to the read source die. Meanwhile, when it is determined not to apply the optimal option (S4401: False), the FM controller 32 configures the default read option 0 to the read source die.

The FM controller performs read from the read source page using a read option configured to the read source die (S4404). When read fails (S4405: False), the FM controller 32 switches the read option configured to the read source die, to another read option according to the rule shown in FIG. 42 (S4406), and performs read using the switched read option (S4404).

When read succeeds (S4405: True), the FM controller 32 checks whether or not to determine to apply the optimal option (S4407). The reason of the check performed in S4407 is to avoid that the optimal read option matching the read source die is rewritten to the default read option 0 when the optimal read option is not applied. That is, when the optimal option is not applied, the read option upon success of read is the default read option 0. However, when S4409 described below is performed, the optimal read option matching the read source die is rewritten to the default read option 0. The check in S4407 is performed to avoid that the optimal read option is rewritten to the default read option 0. S4407 is processing of checking the result in S4401, and is not processing in FIG. 43.

When the determination result in S4407 is true (when the optimal application is applied) (S4407: True), the FM controller 32 determines whether or not the read option upon success of read differs from the optimal read option specified in S4402 (S4408). When the determination result in S4408 is true (S4408: True), the FM controller 32 records in the environment/option simple management information 4501 the read option upon success of read as the optimal read option matching the read source die (S4409).

When the determination result in S4407 is false (when the optimal option is not applied) (S4407: False) or the determination result in S4408 is false (S4408: False), read processing is finished.

Some embodiments have been described above. However, these embodiments are exemplary embodiments for explanation of this invention, and the scope of this invention is not limited to these embodiments. This invention can be implemented in other types of modes. For example, configuring various RR thresholds and controlling execution of commands for preventing a configuration option from being frequently switched as described in Embodiment 1 are also applicable to Embodiment 2. Further, in Embodiment 2, when, for example, at least one of the sub conditions (a) to (d) is satisfied, optimal option application conditions may be satisfied. Furthermore, in S4301 (sub condition (a)) in FIG. 43, even during a period in which inspection read processing of the first cycle after power interruption is performed, if a read source page is a page whose inspection read in inspection read processing of the first cycle succeeds, the determination result in S4301 may be false (S4301: False). Still further, the FM controller 32 may perform control using the read success count management information 452 shown in FIG. 6 when, for example, a capacity of a memory of the FM controller 32 (a capacity of an area in which management information can be stored) is a threshold or more, and perform control using the environment/option simple management information 4501 shown in FIG. 41 when the capacity of the memory of the FM controller 32 is less than a threshold.

REFERENCE SIGNS LIST

300 Storage apparatus

The invention claimed is:

1. A non-volatile memory device comprising:
a non-volatile memory; and
a memory controller configured to execute read from the non-volatile memory using a read option,
the non-volatile memory includes a plurality of memory area units,
wherein each memory area unit includes a plurality of memory areas,
wherein the memory controller is configured to hold management information in which the read option is recorded per memory area unit which is a larger unit than a memory area which is a read unit,
wherein the memory controller is configured to specify a memory area unit including a read source memory area, select a read option matching the specified memory area unit, and execute read from the read source memory area using the selected read option,
wherein the management information includes read success count statistics of each of a plurality of read environments,
wherein each read environment is defined by a combination of values of one or more read influence attributes which influence whether or not the read succeeds,
wherein the one or more read influence attributes include memory area units,
wherein read success count statistics each indicate a read success count per read option,
wherein the memory controller is configured to
specify target read environment which is read environment to which a read source memory area belongs among the plurality of read environments, and
select a plausible read option of the plurality of read options based on target statistics which are read success count statistics matching the target read environment,
wherein the selected read option is the selected plausible read option, and
wherein the memory controller is configured to increase a read success count matching the selected plausible read option of the target statistics when the read succeeds.

2. The non-volatile memory device according to claim 1,
wherein the non-volatile memory includes a plurality of memory chips,
wherein each memory chip includes one or more memory area units,
wherein each memory area unit includes two or more memory areas and is a configuration unit of a read option,
wherein the memory controller and the plurality of memory chips are coupled to a plurality of buses and a plurality of chip enable lines,
wherein the memory controller is configured to select a read source memory chip by selecting a bus and a chip enable line coupled to the read source memory chip, and, when the selected read option and a read option configured to a memory area unit including the read source memory area are different, change the configuration option to the selected read option and execute the read using the changed configuration option,
wherein each memory area is a page which is a read unit,
wherein each memory area unit includes a plurality of blocks,
wherein each block is a data erasure unit, and includes a plurality of pages,
wherein each page corresponds to either type of a LSB (Least Significant bit/byte) or a MSB (Most Significant bit/byte), and
wherein the one or more read influence attributes is at least one of a data erasure count of a block, an elapsed time passed after data is written in a top page of the block, a bus, a chip enable line, a memory area unit and a page type.

3. The non-volatile memory device according to claim 2,
wherein each memory area unit includes a first memory area sub unit including an odd-numbered block and a second memory area sub unit including an even-numbered block, and
wherein the one or more read influence attributes is at least one of a data erasure count of a block, an elapsed time passed after data is written in a top page of the block, a bus, a chip enable line, a memory area unit, a memory area sub unit and a page type.

4. The non-volatile memory device according to claim 1,
wherein the memory controller is configured to, when the selected read option and a configuration option which is a read option configured to the memory area unit including the read source memory area are different, change the configuration option to the selected read option and execute the read using the changed configuration option,
wherein executing the read includes issuing and executing a read command, and
wherein the memory controller is configured to continuously execute a plurality of read commands using the same read option per read option.

5. The non-volatile memory device according to claim 4,
wherein the non-volatile memory device is coupled to an upper device transmitting a read request,
wherein the memory controller is configured to receive a read request from the upper apparatus, issue and execute the read command according to the read request and transmit to the upper apparatus a response in response to the read request, and
wherein the number of read commands to be continuously executed per read option is a number corresponding to a response time limit with respect to the upper apparatus, a total number of execution queue read commands and characteristics of the read option.

6. The non-volatile memory device according to claim 4,
wherein the memory controller is configured to manage a plurality of read commands using the same read option per read option in a unit larger than a configuration unit of a read option.

7. The non-volatile memory device according to claim 1,
wherein a read option recorded per memory area unit in the management information is an optimal read option which is a read option used when previous read from the memory area unit succeeds, and
wherein the memory controller is configured to determine whether or not read satisfies an application condition of the optimal read option, and, when a determination result is true, select from the management information an optimal read option matching a memory area unit including a read source memory area.

8. The non-volatile memory device according to claim 7, wherein each of the memory area units includes a plurality of blocks,
wherein each block includes a plurality of pages,
wherein each page is a memory area which is a read unit,
wherein the application satisfies at least one of following sub conditions (a) to (d):
  (a) read is read in a period in which inspection read processing of a first cycle after power interruption is performed, or a read source page is a page whose inspection read does not succeed yet in the inspection read processing of the first cycle after the power interruption,
  (b) an uncorrectable error occurs in any of pages in a memory area unit including a read source page,
  (c) a read source block which is a block including a read source page is not a refreshed block after the power interruption, and
  (d) the read source block is not an open block, and
wherein the inspection read is read for checking the number of error bits of data,
wherein the inspection read processing is processing of performing inspection read from each of all inspection target pages,
wherein the refreshed block is a data migration destination block which is read from a migration source block and whose error is corrected, and
wherein the open block is a block in which data is written halfway in pages.

9. The non-volatile memory device according to claim 8, wherein the read being satisfied under the application condition signifies that all of the sub conditions (a) to (c) are satisfied.

10. The non-volatile memory device according to claim 9, wherein the read being satisfied under the application condition signifies that the sub condition (d) is further satisfied.

11. The non-volatile memory device according to claim 8, wherein the memory controller is configured to, when the determination result is false, perform read from a read source page using a default read option, and
wherein a read option used for the inspection read is the same as the default read option.

12. The non-volatile memory device according to claim 7, wherein the memory controller is configured to, when read using the selected optimal read option fails, retry read from a read source memory area using a read option different from the selected optimal read option, and
wherein, when the retried read succeeds, records in the management information a read option used upon successful read as an optimal read option matching a memory area unit including the read source memory area.

13. A storage apparatus comprising:
a RAID (Redundant Array of Independent (or Inexpensive) Disks) group including a plurality of non-volatile memory devices; and
a storage controller configured to transmit a read request to each non-volatile memory device which forms the RAID group,
wherein each non-volatile memory device includes a non-volatile memory and a memory controller configured to execute read from the non-volatile memory using a read option according to the read request,
wherein the non-volatile memory includes a plurality of memory area units,
wherein each memory area unit includes a plurality of memory areas, the memory controller is configured to hold management information in which a read option is recorded per memory area unit which is a unit larger than a memory area which is a read unit, and
wherein the memory controller is configured to
  specify a memory area unit including a read source memory area,
  select a read option matching the specified memory area unit, and
  execute read from the read source memory area using the selected read option,
wherein the storage controller is configured to transmit to each non-volatile memory device a configuration command which is a command for specifying a plurality of types of read retry count thresholds (RR thresholds) matching a plurality of read types, respectively,
wherein the memory controller is configured to receive the configuration command, and store the plurality of types of RR thresholds specified by the configuration command,
wherein the memory controller selects a read option different from a previous read option when the read fails and a repetition count of the read from the read source memory area is less than a RR threshold of a type matching a type of the read among the plurality of types of RR thresholds, and execute the read from the read source memory area using the selected read option, and
wherein various RR thresholds are determined based on at least one of a RAID configuration of the RAID group, whether or not the RAID group includes redundancy, the number of non-volatile memory devices blocked in the RAID group, and whether or not the RAID group values performance.

14. The storage apparatus according to claim 13,
wherein the storage apparatus is coupled to a management terminal, and
wherein the storage controller is configured to receive each RR threshold from the management terminal, and store each RR threshold.

15. The storage apparatus according to claim 13,
wherein the configuration command is configured to further specify a read mode which is a selection policy of a read option,
wherein each memory controller is configured to select the read option according to the read mode specified by the received configuration command, and transmit to the storage controller a predetermined response to a read request from the upper apparatus when a predetermined error occurs,
wherein the storage controller is configured to, when receiving the predetermined response, transmit a special read request which is a read request of a specified read mode, to a transmission source memory controller of the received check response, and
wherein the memory controller which receives the special read request is configured to prioritize a read mode specified by the special read request over the read mode specified by the configuration command.

16. The storage apparatus according to claim 13,
wherein the storage controller is configured to, when receiving the predetermined response, select either the configuration command or a special read request which is a read request of a specified read mode according to a situation in which the predetermined response is received, and transmit one of the configuration command and the special read request to a transmission source memory controller of the received check response, and wherein the configuration command is a command which needs to suspend reception of the read request at the memory controller.

17. The storage apparatus according to claim 13, wherein a read option recorded per memory area unit in the management information is an optimal read option which is a read option used when previous read from the memory area unit succeeds, and wherein the memory controller is configured to determine whether or not the read satisfies an application condition of the optimal read option and, when a determination result is true, select from the management information an optimal read option matching a memory area unit including a read source memory area.

* * * * *